United States Patent
Tamura

(10) Patent No.: US 7,018,890 B2
(45) Date of Patent: Mar. 28, 2006

(54) NON-VOLATILE SEMICONDUCTOR MEMORY DEVICE AND MANUFACTURING METHOD THEREOF

(75) Inventor: Nobuyuki Tamura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 112 days.

(21) Appl. No.: 10/839,253

(22) Filed: May 6, 2004

(65) Prior Publication Data

US 2004/0207004 A1 Oct. 21, 2004

Related U.S. Application Data

(62) Division of application No. 10/281,176, filed on Oct. 28, 2002, now abandoned.

(30) Foreign Application Priority Data

Oct. 29, 2001 (JP) .............................. 2001-330748

(51) Int. Cl.
*H01L 21/8247* (2006.01)

(52) U.S. Cl. ...................................... 438/241; 438/258

(58) Field of Classification Search ................ 438/241, 438/257–267
See application file for complete search history.

(56) References Cited

U.S. PATENT DOCUMENTS

| 6,214,665 | B1 | 4/2001 | Sakui | |
| 6,677,196 | B1 * | 1/2004 | Ishige | ........................ 438/239 |
| 6,780,715 | B1 * | 8/2004 | Jeong | ........................ 438/275 |
| 2001/0054736 | A1 * | 12/2001 | Ishige | ........................ 257/314 |

FOREIGN PATENT DOCUMENTS

JP 2001-60675 3/2001

* cited by examiner

*Primary Examiner*—Richard A. Booth
(74) *Attorney, Agent, or Firm*—McDermott Will & Emery LLP

(57) ABSTRACT

The non-volatile semiconductor memory device has a booster including a capacitor, and a storage circuit including a storage element. The capacitor has a lower electrode, a capacitor capacitance insulating film and an upper electrode. The lower electrode of the capacitor is shaped to have an increased surface area.

19 Claims, 27 Drawing Sheets

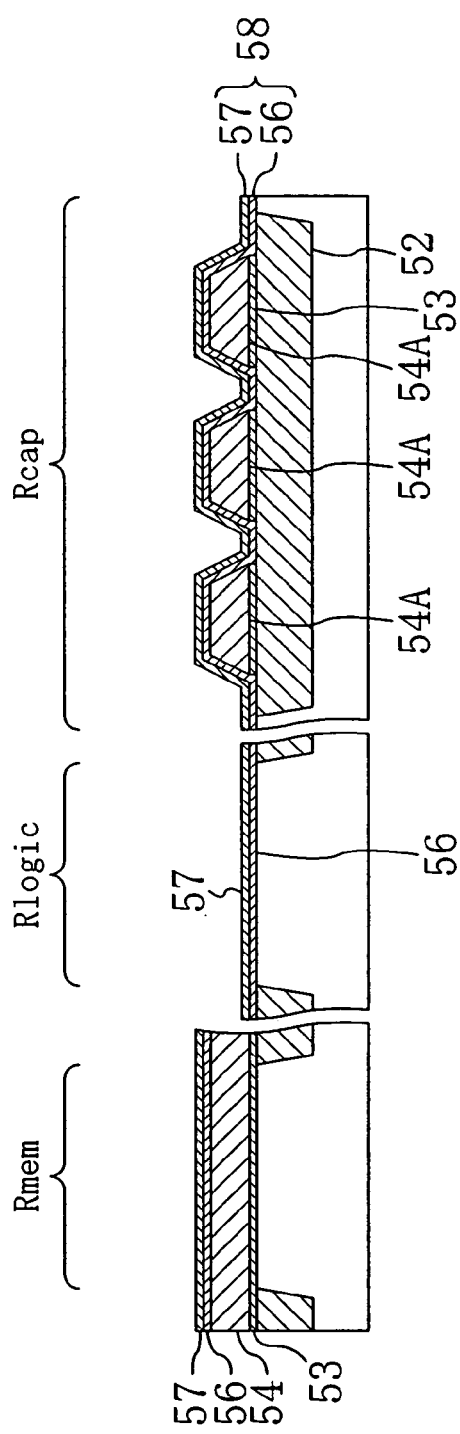
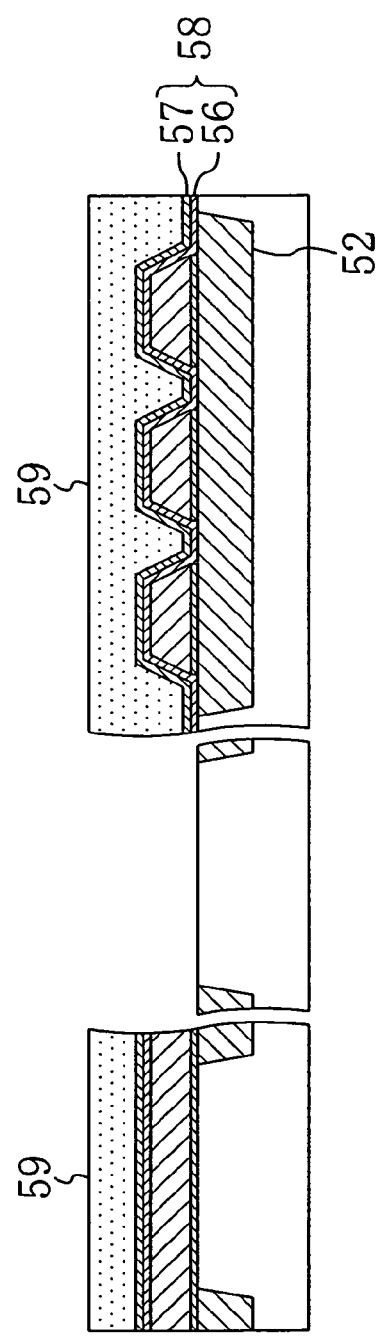
FIG. 6A
FIG. 6B

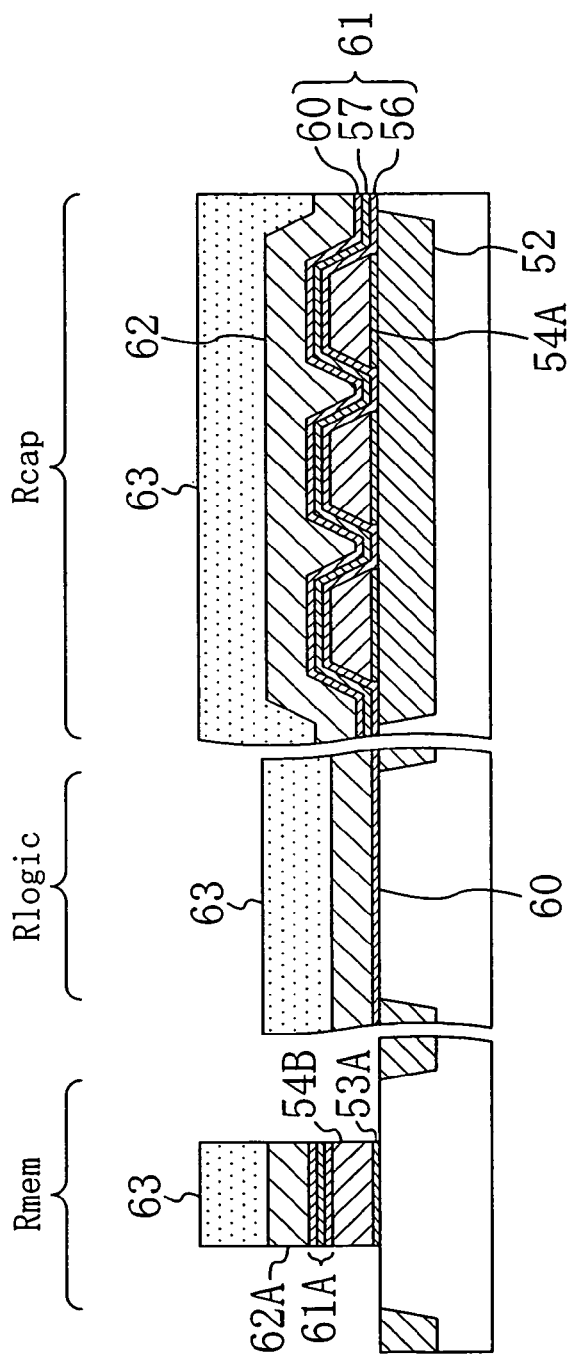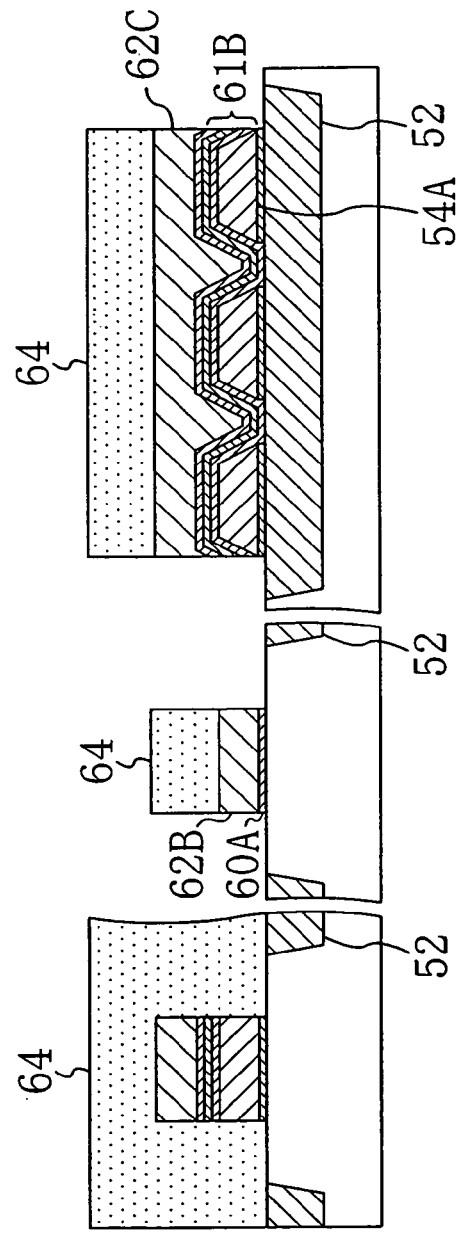
FIG. 7A
FIG. 7B

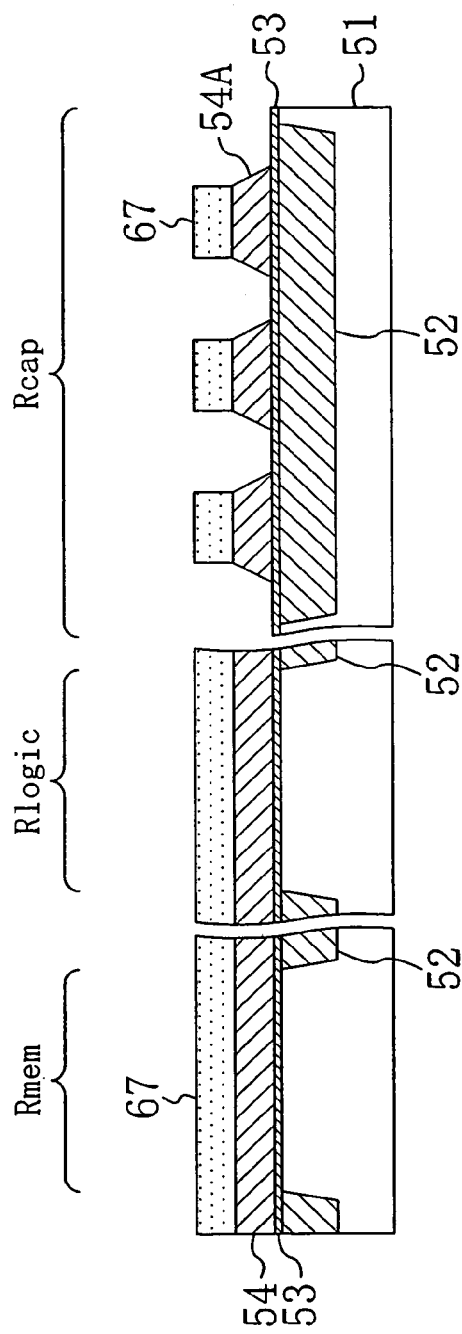
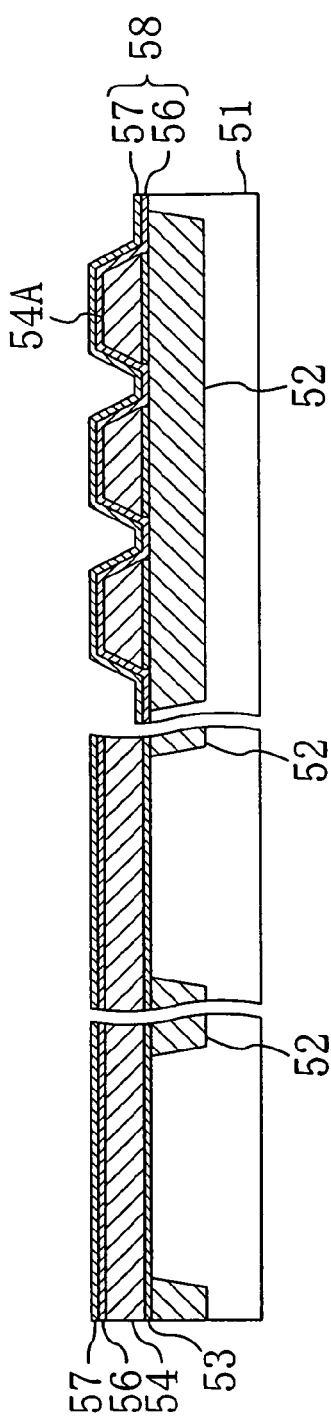
FIG. 9A
FIG. 9B

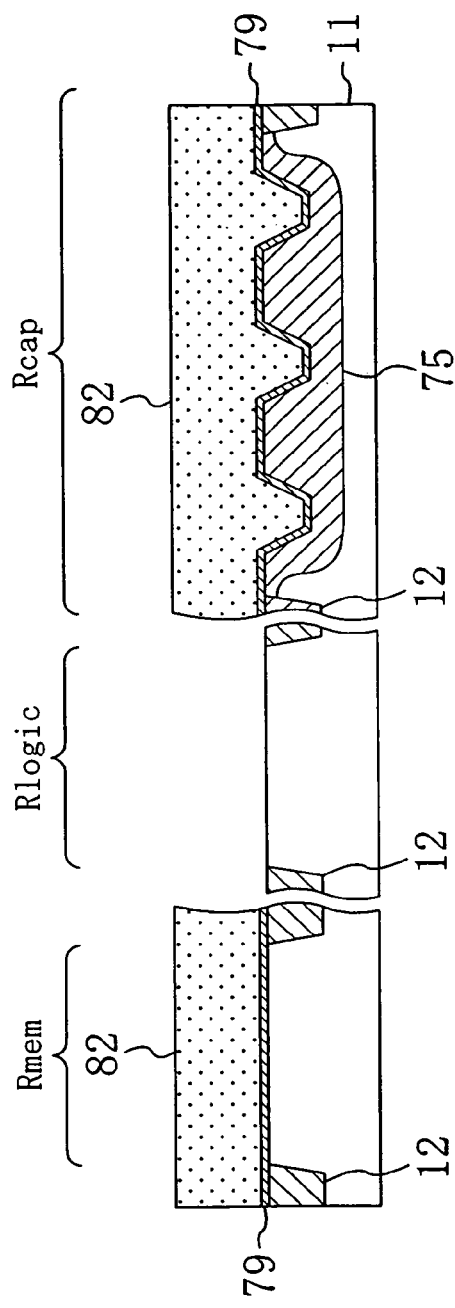
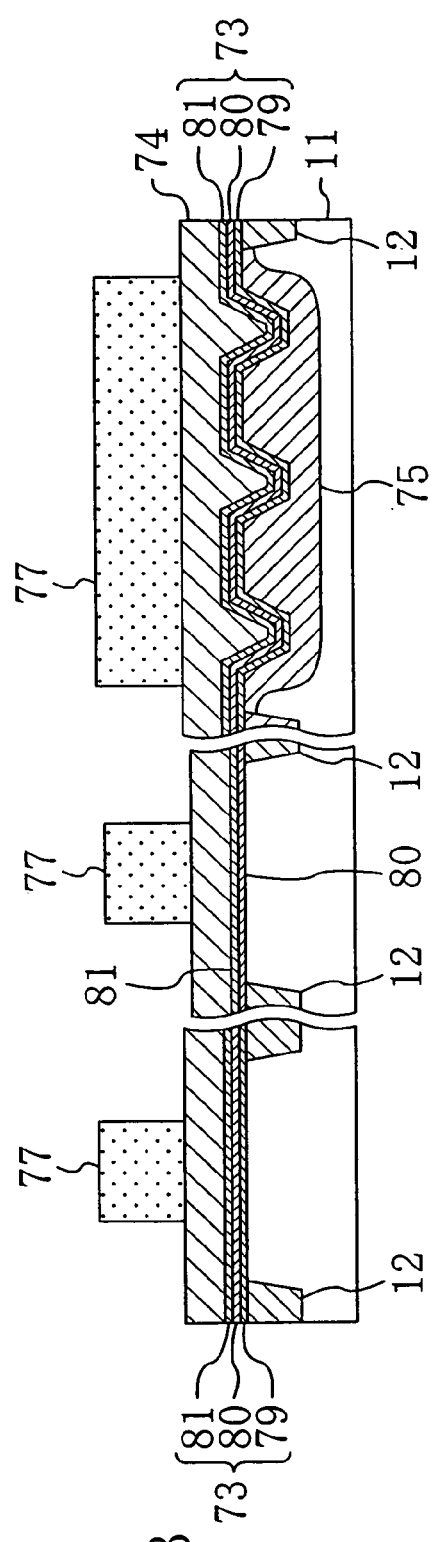
FIG. 16A
FIG. 16B

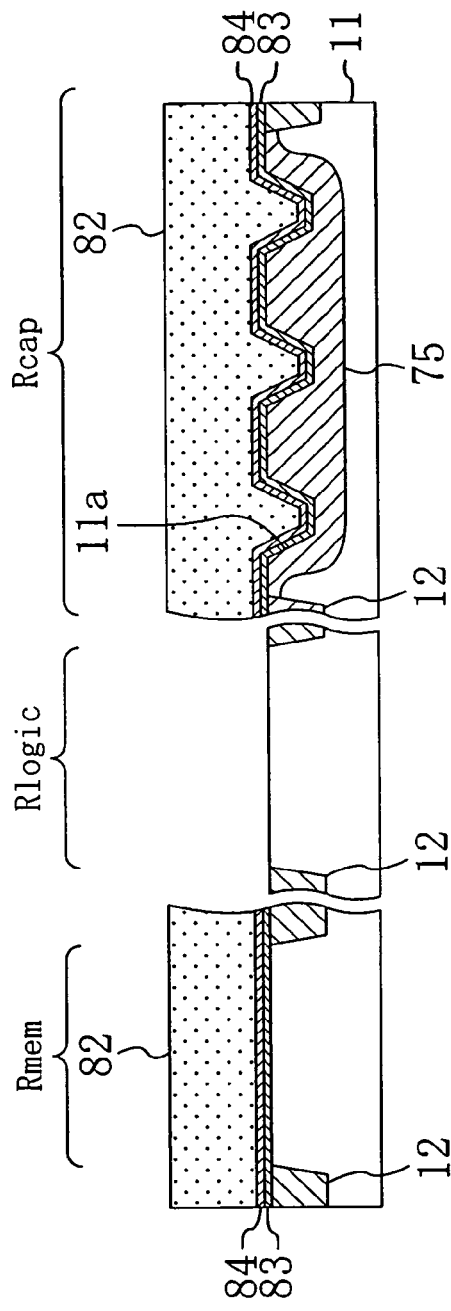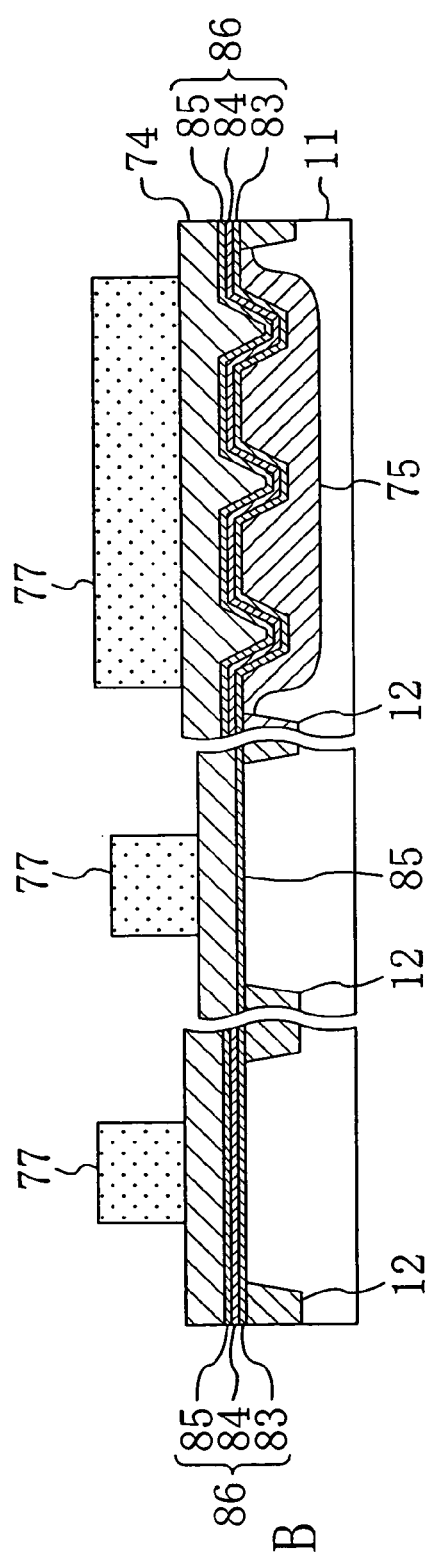
FIG. 18A
FIG. 18B

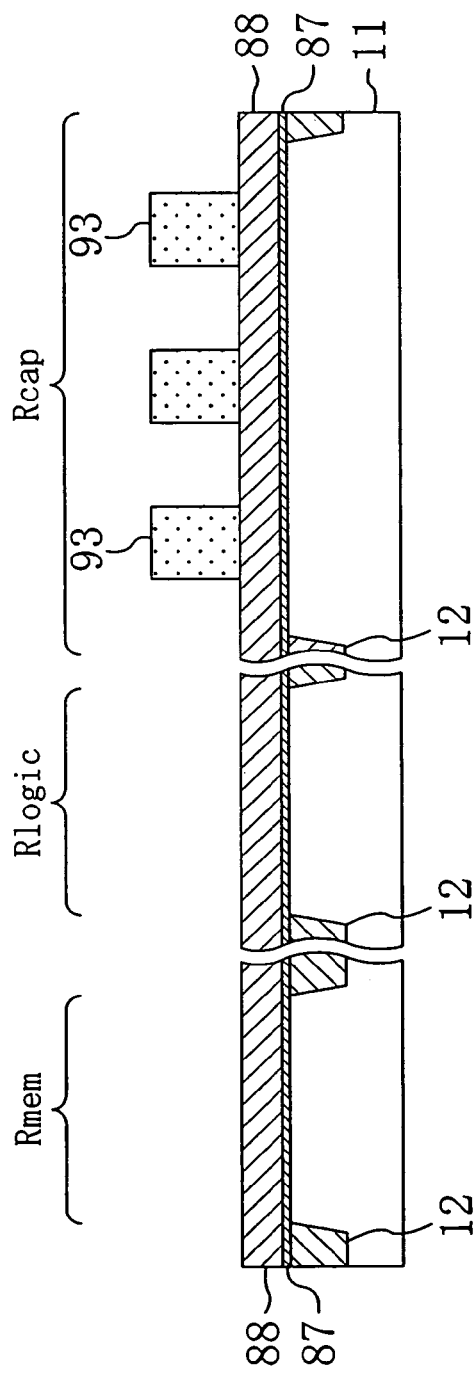
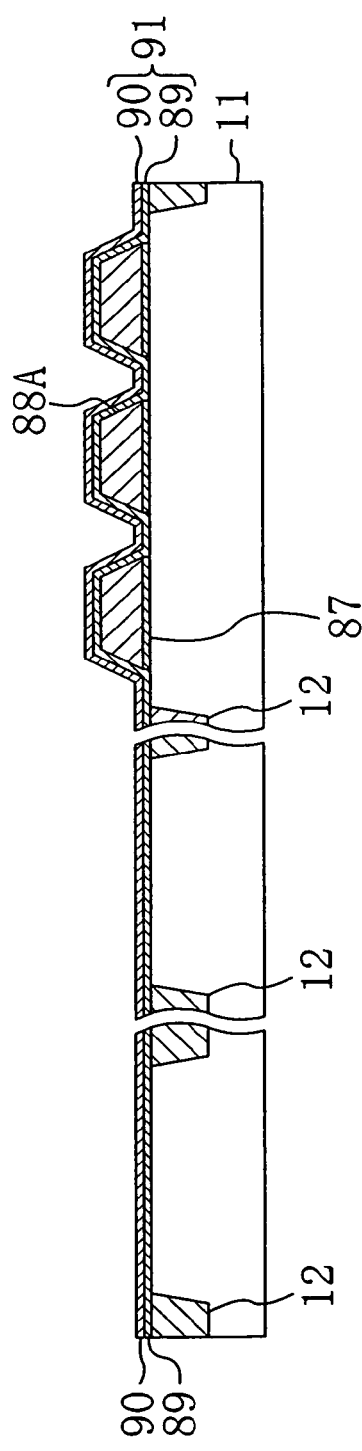
FIG. 20A
FIG. 20B

NON-VOLATILE SEMICONDUCTOR MEMORY DEVICE AND MANUFACTURING METHOD THEREOF This application is a divisional of application Ser. No. 10/281,176 filed Oct. 28, 2002 now abandoned.

BACKGROUND OF THE INVENTION

The present invention generally relates to a non-volatile semiconductor memory device. More particularly, the present invention relates to a non-volatile semiconductor memory device having a booster including a capacitor.

Electrically writable and erasable non-volatile semiconductor memory devices such as flash memory devices and EEPROM (Electrically Erasable and Programmable Read Only Memory) devices use two different voltages, one for read operation and one for write and erase operations. For example, a power supply voltage of 5 V is used for read operation, and a voltage of 12 V, i.e., the power supply voltage boosted by a booster, is used for write and erase operations.

In a conventional non-volatile semiconductor memory device, a booster is formed by booster cells connected in parallel. Each booster cell is formed by a switching element and a capacitor. The capacitor in the booster has a square shape of about 200 μm×about 200 μm and is formed by plate-like upper and lower electrodes facing each other with a capacitance insulating film interposed therebetween. The capacitor having a larger capacitance provides a greater boosting effect.

On the other hand, with recent progress in reduction in size and voltage of a semiconductor device, a reduced power supply voltage is often used especially in a non-volatile semiconductor memory device incorporating a logic circuit. Therefore, the booster must conduct the boosting operation more frequently.

For the conventional non-volatile semiconductor memory device, however, it is difficult to sufficiently boost such a reduced power supply voltage. Therefore, it is necessary to increase the capacitance of the capacitor included in the booster. This requires either the use of a special capacitance insulating film such as a ferroelectric film or increase in area of the capacitance insulating film. However, using a special insulating film in the capacitor alone would make the process of forming the capacitor more complex than the process of forming a storage element, a logic element and the like. Therefore, it is difficult from the standpoint of manufacturing costs to use such a special capacitance insulating film. Moreover, increasing the area of the capacitor would impede reduction in size of the non-volatile semiconductor memory device.

As described above, in the conventional non-volatile semiconductor memory device, it is difficult to obtain a capacitor of a booster which enables reduction in size and voltage.

SUMMARY OF THE INVENTION

The present invention is made to solve the above problems, and it is an object of the present invention to obtain a capacitor of a booster which enables reduction in size and voltage of a non-volatile semiconductor memory device without increasing manufacturing costs.

In order to achieve the above object, a non-volatile semiconductor memory device according to a first aspect of the present invention includes a booster and a storage element. The booster includes a capacitor having a lower electrode, a capacitor capacitance insulating film and an upper electrode. The lower electrode is shaped to have an increased surface area.

The non-volatile semiconductor memory device of the first aspect enables a capacitance of the capacitor to be increased without increasing the area of the capacitor. As a result, a capacitor enabling reduction in voltage of the non-volatile semiconductor memory device without impeding reduction in size of the non-volatile semiconductor memory device can be obtained.

In the non-volatile semiconductor memory device of the first aspect, the lower electrode preferably has a plurality of holes.

In the non-volatile semiconductor memory device of the first aspect, the lower electrode is preferably formed by a plurality of island-shaped lower electrode portions.

In the non-volatile semiconductor memory device of the first aspect, the lower electrode is preferably formed by a plurality of stripe-shaped lower electrode portions.

In this case, a distance S between the lower electrode portions and a thickness T of the lower electrode portions preferably have a relation of $S \leq 2$ T. This ensures that the total area of the side surfaces of the stripe-shaped lower electrode portions is greater than the area of a region of the top surface of the lower electrode, which is removed by forming the stripe-shaped lower electrode portions. As a result, the surface area of the lower electrode is reliably increased.

In the non-volatile semiconductor memory device of the first aspect, a voltage V1 which is applied to the upper electrode and a voltage V2 which is applied to the lower electrode preferably have a relation of V1<V2. This prevents an electric field from being intensively applied to the corners of the lower electrode, enabling improvement in reliability of the capacitor capacitance insulating film.

In the non-volatile semiconductor memory device of the first aspect, the lower electrode preferably has a plurality of concavities.

In the non-volatile semiconductor memory device of the first aspect, the lower electrode preferably has a plurality of convexities.

In the non-volatile semiconductor memory device of the first aspect, the lower electrode preferably has a plurality of stripe-shaped convexities.

In the non-volatile semiconductor memory device of the first aspect, the storage element preferably has a tunnel insulating film, a floating gate electrode, a storage element capacitance insulating film and a control gate electrode. The floating gate electrode and the lower electrode are preferably formed from a conductive film which is formed in a same step. The storage element capacitance insulating film and the capacitor capacitance insulating film are preferably formed from an insulating film which is formed in a same step. The control gate electrode and the upper electrode are preferably formed from a conductive film which is formed in a same step. This enables the step of forming the storage element and the step of forming the capacitor to be partially conducted in the same process. Therefore, the non-volatile semiconductor memory device including the capacitor of the present invention can be manufactured without increasing costs.

According to a second aspect of the present invention, a method for manufacturing a non-volatile semiconductor memory device includes: a first step of forming an element isolation insulating film in a semiconductor substrate in order to define a storage circuit region and a capacitor region; a second step of forming a plate-like conductive film in the capacitor region and etching the plate-like conductive film to form a lower electrode having an increased surface area; a third step of forming a capacitor capacitance insulating film and an upper electrode on the lower electrode; and a fourth step of forming in the storage circuit region a storage element having a tunnel insulating film, a floating gate electrode, a storage element capacitance insulating film and a control gate electrode.

The manufacturing method of the second aspect enables a capacitance of the capacitor to be increased without increasing the area of the capacitor. As a result, a capacitor having a capacitance large enough to enable reduction in voltage can be reliably obtained.

In the manufacturing method of the second aspect, the lower electrode is preferably formed into a plurality of holes, a plurality of island-shaped lower electrode portions, or a plurality of stripe-shaped lower electrode portions by etching a whole thickness of the conductive film in the second step. This enables the surface area of the lower electrode to be increased without controlling the etching time. As a result, the manufacturing process can be simplified as compared to the case where only an upper portion of the conductive film is etched.

In the manufacturing method of the second aspect, the lower electrode is preferably formed into a plurality of concavities, a plurality of convexities, or a plurality of stripe-shaped convexities by etching only an upper portion of the conductive film in the second step. This prevents loss of the surface area of the capacitor from being caused by etching. As a result, the surface area of the lower electrode is reliably increased.

In the manufacturing method of the second aspect, the floating gate electrode and the lower electrode are preferably formed from a conductive film which is formed in a same step. The storage element capacitance insulating film and the capacitor capacitance insulating film are preferably formed from an insulating film which is formed in a same step. The control gate electrode and the upper electrode are preferably formed from a conductive film which is formed in a same step. This enables the step of forming the storage element and the step of forming the capacitor to be partially conducted in the same process. Therefore, the manufacturing costs are not increased by forming the capacitor of the present invention.

According to a third aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of sequentially forming a first insulating film and a first conductive film on the semiconductor substrate and removing the first conductive film in the logic circuit region; a third step of etching the first conductive film in the capacitor region to form a lower electrode having an increased surface area; a fourth step of removing the first insulating film in the logic circuit region and an exposed portion of the first insulating film in the capacitor region and forming a second insulating film on the first conductive film in the storage circuit region, the semiconductor substrate in the logic circuit region, and the lower electrode in the capacitor region; a fifth step of removing the second insulating film in the logic circuit region and sequentially forming a third insulating film and a second conductive film on the second insulating film in the storage circuit region and the capacitor region and on the semiconductor substrate in the logic circuit region; a sixth step of forming in the storage circuit region a tunnel insulating film from the first insulating film, a floating gate electrode from the first conductive film, a storage element capacitance insulating film from the second and third insulating films, and a control gate electrode from the second conductive film; a seventh step of forming in the logic circuit region a gate insulating film from the third insulating film and a gate electrode from the second conductive film; and an eighth step of forming in the capacitor region a capacitor capacitance insulating film from the second and third insulating films and an upper electrode from the second conductive film.

The manufacturing method of the third aspect provides the same effects as those of the manufacturing method of the second aspect. Moreover, the step of forming the capacitor and the step of forming the storage element and the logic element are partially conducted in the same process. This enables the capacitor to be formed without increasing the manufacturing costs.

In the manufacturing method of the third aspect, the lower electrode is preferably formed into a plurality of holes, a plurality of island-shaped lower electrode portions, or a plurality of stripe-shaped lower electrode portions by etching a whole thickness of the first conductive film in the third step.

In the manufacturing method of the third aspect, the lower electrode is preferably formed into a plurality of concavities, a plurality of convexities, or a plurality of stripe-shaped convexities by etching only an upper portion of the first conductive film in the third step.

According to a fourth aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of sequentially forming a first insulating film and a first conductive film on the semiconductor substrate; a third step of etching the first conductive film in the capacitor region to form a lower electrode having an increased surface area; a fourth step of forming a second insulating film on the first conductive film in the storage circuit region and the logic circuit region and on the lower electrode in the capacitor region; a fifth step of removing the first insulating film, the first conductive film and the second insulating film in the logic circuit region and sequentially forming a third insulating film and a second conductive film on the second insulating film in the storage circuit region and the capacitor region and on the semiconductor substrate in the logic circuit region; a sixth step of forming in the storage circuit region a tunnel insulating film from the first insulating film, a floating gate electrode from the first conductive film, a storage element capacitance insulating film from the second and third insulating films, and a control gate electrode from the second conductive film; a seventh step of forming in the logic circuit region a gate insulating film from the third insulating film and a gate electrode from the second conductive film; and an eighth step of forming in the capacitor region a capacitor capacitance insulating film from the second and third insulating films and an upper electrode from the second conductive film.

The manufacturing method of the fourth aspect provides the same effects as those of the manufacturing method of the second and third aspects. Moreover, the first insulating film, the first conductive film and the second insulating film in the logic circuit region are removed in the same step. As a result, the manufacturing process can further be simplified.

In the manufacturing method of the fourth aspect, the lower electrode is preferably formed into a plurality of holes, a plurality of island-shaped lower electrode portions, or a plurality of stripe-shaped lower electrode portions by etching a whole thickness of the conductive film in the third step.

In the manufacturing method of the fourth aspect, the lower electrode is preferably formed into a plurality of concavities, a plurality of convexities, or a plurality of stripe-shaped convexities by etching only an upper portion of the conductive film in the third step.

In the non-volatile semiconductor memory device of the first aspect, the storage element preferably has a charge storage film and a gate electrode. The charge storage film and the capacitor capacitance insulating film are preferably formed from an insulating film which is formed in a same step. The gate electrode and the upper electrode are preferably formed from a conductive film which is formed in a same step. This enables the step of forming the storage element and the step of forming the capacitor to be partially conducted in the same process.

According to a fifth aspect of the present invention, a method for manufacturing a non-volatile semiconductor memory device includes: a first step of forming an element isolation insulating film in a semiconductor substrate in order to define a storage circuit region and a capacitor region; a second step of forming a concavity in a semiconductor substrate included in the capacitor region, and implanting impurities into the concavity to form a lower electrode; a third step of sequentially forming an insulating film and a conductive film on the semiconductor substrate including the lower electrode; a fourth step of forming in the storage circuit region a charge storage film from the insulating film and a first gate electrode from the conductive film; and a fifth step of forming in the capacitor region a capacitor capacitance insulating film from the insulating film and an upper electrode from the conductive film.

In the manufacturing method of the fifth aspect, the semiconductor substrate having impurities implanted thereinto is used as the lower electrode. Accordingly, by forming a concavity in the semiconductor substrate, the capacitance of the capacitor can be increased without increasing the area of the capacitor. Moreover, since the step of forming the storage element and the step of forming the capacitor are partially conducted in the same process, the manufacturing costs are not increased.

In the third step of the manufacturing method of the fifth aspect, the insulating film is preferably formed by depositing a silicon oxide film on the semiconductor substrate and nitriding an upper portion of the deposited silicon oxide film.

In the third step of the manufacturing method of the fifth aspect, the insulating film is preferably formed by sequentially depositing a silicon oxide film and a silicon nitride film on the semiconductor substrate. Since the semiconductor substrate is covered with the silicon nitride film, the shape of the lower electrode is less likely to be varied. Accordingly, degradation of the capacitor capacitance insulating film can be suppressed.

In the third step of the manufacturing method of the fifth aspect, the insulating film is preferably formed by sequentially forming a first silicon oxide film, a second silicon oxide film and a silicon nitride film on the semiconductor substrate. This enables improvement in reliability of the charge storage film and the capacitor capacitance insulating film.

In the third step of the manufacturing method of the fifth aspect, the insulating film is preferably formed by sequentially forming a first silicon oxide film, a silicon nitride film and a second silicon oxide film on the semiconductor substrate. This enables improvement in reliability of the charge storage film and the capacitor capacitance insulating film.

In the second step of the manufacturing method of the fifth aspect, the lower electrode is preferably formed into a plurality of concavities, a plurality of convexities, or a plurality of stripe-shaped convexities.

According to a sixth aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of forming a concavity in the semiconductor substrate included in the capacitor region, and introducing impurities into the semiconductor substrate from a wall surface and a bottom surface of the concavity to form a lower electrode; a third step of sequentially forming a first insulating film, a second insulating film and a first conductive film on the semiconductor substrate including the lower electrode; a fourth step of forming in the storage circuit region a charge storage film from the first insulating film and the second insulating film and a first gate electrode from the first conductive film; a fifth step of forming in the logic circuit region a gate insulating film from the first insulating film and the second insulating film and a second gate electrode from the first conductive film; and a sixth step of forming in the capacitor region a capacitor capacitance insulating film from the first insulating film and the second insulating film and an upper electrode from the first conductive film.

In the manufacturing method of the sixth aspect, the semiconductor substrate having impurities implanted thereinto is used as the lower electrode. Accordingly, by forming a concavity in the semiconductor substrate, the capacitance of the capacitor can be increased without increasing the area of the capacitor. Moreover, since the step of forming the storage element, the step of forming the logic element, and the step of forming the capacitor are partially conducted in the same process, the manufacturing costs are not increased. Moreover, the gate insulating film is a lamination of the first insulating film and the second insulating film. This enables formation of a reliable logic element.

In the third step of the manufacturing method of the sixth aspect, the second insulating film is preferably formed by nitriding an upper portion of the first insulating film.

In the third step pf the manufacturing method of the sixth aspect, the second insulating film is preferably formed by depositing a silicon nitride film on the first insulating film. Since the semiconductor substrate is covered with the silicon nitride film, the shape of the lower electrode is less likely to be varied. Accordingly, degradation of the capacitor capacitance insulating film can be suppressed.

In the manufacturing method of the sixth aspect, the first insulating film is preferably a silicon oxide film. This enables improvement in reliability of the charge storage film, the gate insulating film and the capacitor capacitance insulating film.

In the second step of the manufacturing method of the sixth aspect, the lower electrode is preferably formed into a plurality of concavities, a plurality of convexities, or a plurality of stripe-shaped convexities.

According to a seventh aspect, a method for manufacturing a non-volatile semiconductor memory device includes: a first step of forming an element isolation insulating film in a semiconductor substrate in order to define a storage circuit region, a logic circuit region and a capacitor region; a second step of forming a concavity in the semiconductor substrate included in the capacitor region, and introducing impurities into the semiconductor substrate from a wall surface and a bottom surface of the concavity to form a lower electrode; a third step of forming a first insulating film on the semiconductor substrate including the lower electrode; a fourth step of removing the first insulating film included in the logic circuit region; a fifth step of sequentially depositing a second insulating film, a third insulating film and a first conductive film on an exposed surface of the semiconductor substrate in the logic circuit region and on the first insulating film in the storage circuit region and the capacitor region; a sixth step of forming in the storage circuit region a charge storage film from the first insulating film, the second insulating film and the third insulating film and a first gate electrode from the first conductive film; a seventh step of forming in the logic circuit region a gate insulating film from the second insulating film and the third insulating film and a second gate electrode from the first conductive film; and an eighth step of forming in the capacitor region a capacitor capacitance insulating film from the first insulating film, the second insulating film and the third insulating film and an upper electrode from the first conductive film.

In the manufacturing method of the seventh aspect, the semiconductor substrate having impurities implanted thereinto is used as the lower electrode. Accordingly, by forming a concavity in the semiconductor substrate, the capacitance of the capacitor can be increased without increasing the area of the capacitor. Moreover, since the step of forming the storage element, the step of forming the logic element, and the step of forming the capacitor are partially conducted in the same process, the manufacturing costs are not increased. Moreover, the gate insulating film is a lamination of the second insulating film and the third insulating film. This improves reliability of the gate insulating film.

In the manufacturing method of the seventh aspect, each of the first insulating film and the second insulating film is preferably a silicon oxide film. This enables improvement in reliability of the charge storage film, the gate insulating film and the capacitor capacitance insulating film.

In the manufacturing method of the seventh aspect, the third insulating film is preferably a silicon nitride film. This enables improvement in reliability of the charge storage film, the gate insulating film and the capacitor capacitance insulating film, and also enables reduction in thickness of the gate insulating film without degrading reliability of the logic element.

In the second step of the manufacturing method of the seventh aspect, the lower electrode is preferably formed into a plurality of concavities, a plurality of convexities, or a plurality of stripe-shaped convexities.

According to an eighth aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of forming a concavity in the semiconductor substrate included in the capacitor region, and introducing impurities into the semiconductor substrate from a wall surface and a bottom surface of the concavity to form a lower electrode; a third step of sequentially forming a first insulating film and a second insulating film on the semiconductor substrate including the lower electrode; a fourth step of sequentially removing the second insulating film and the first insulating film which are included in the logic circuit region; a fifth step of sequentially depositing a third insulating and a second conductive film on an exposed surface of the semiconductor substrate in the logic circuit region and on the first insulating film in the storage circuit region and the capacitor region; a sixth step of forming in the storage circuit region a charge storage film from the first insulating film, the second insulating film and the third insulating film and a first gate electrode from the first conductive film; a seventh step of forming in the logic circuit region a gate insulating film from the third insulating film and a second gate electrode from the first conductive film; and an eighth step of forming in the capacitor region a capacitor capacitance insulating film from the first insulating film, the second insulating film and the third insulating film and an upper electrode from the first conductive film.

In the manufacturing method of the eighth aspect, the semiconductor substrate having impurities implanted thereinto is used as the lower electrode. Accordingly, by forming a concavity in the semiconductor substrate, the capacitance of the capacitor can be increased without increasing the area of the capacitor. Moreover, since the step of forming the storage element, the step of forming the logic element, and the step of forming the capacitor are partially conducted in the same process, the manufacturing costs are not increased. Moreover, the gate insulating film is formed only from the third insulating film. This facilitates reduction in thickness of the gate insulating film.

In the manufacturing method of the eighth aspect, each of the first insulating film and the third insulating film is preferably a silicon oxide film. This enables improvement in reliability of the charge storage film, the gate insulating film and the capacitor capacitance insulating film.

In the manufacturing method of the eighth aspect, the second insulating film is preferably a silicon nitride film. This enables improvement in reliability of the charge storage film and the capacitor capacitance insulating film.

In the second step of the manufacturing method of the eighth aspect, the lower electrode is preferably formed into a plurality of concavities, a plurality of convexities, or a plurality of stripe-shaped convexities.

According to a ninth aspect of the present invention, a method for manufacturing a non-volatile semiconductor memory device includes: a first step of forming an element isolation insulating film in a semiconductor substrate in order to define a storage-circuit region and a capacitor region; a second step of depositing a first conductive film on the semiconductor substrate and etching the first conductive film in the capacitor region to form a lower electrode having an increased surface area; a third step of sequentially forming an insulating film and a second conductive film on the semiconductor substrate including the lower electrode; a fourth step of forming in the storage circuit region a charge storage film from the insulating film and a first gate electrode from the second conductive film; and a fifth step of forming in the capacitor region a capacitor capacitance insulating film from the insulating film and an upper electrode from the second conductive film.

In the manufacturing method of the ninth aspect, the lower electrode is formed from a conductive film. Therefore, the lower electrode is less likely to be subjected to depletion as compared to the case where the semiconductor substrate is used for the lower electrode. As a result, stable capacitor characteristics can be obtained. Moreover, since the step of forming the storage element and the step of forming the capacitor are partially conducted in the same process, the manufacturing costs are not increased.

In the third step of the manufacturing method of the ninth aspect, the insulating film is preferably formed by depositing a silicon oxide film on the semiconductor substrate and then nitriding an upper portion of the deposited silicon oxide film.

In the third step of the manufacturing method of the ninth aspect, the insulating film is preferably formed by sequentially depositing a silicon oxide film and a silicon nitride film on the semiconductor substrate. Since the conductive film is covered with the silicon nitride film, the shape of the lower electrode is less likely to be varied. Accordingly, degradation of the capacitor capacitance insulating film can be suppressed.

In the third step of the manufacturing method of the ninth aspect, the insulating film is preferably formed by sequentially forming a first silicon oxide film, a second silicon oxide film and a silicon nitride film on the semiconductor substrate. This enables improvement in reliability of the charge storage film and the capacitor capacitance insulating film.

In the third step of the manufacturing method of the ninth aspect, the insulating film is preferably formed by sequentially forming a first silicon oxide film, a silicon nitride film and a second silicon oxide film on the semiconductor substrate. This enables improvement in reliability of the charge storage film and the capacitor capacitance insulating film.

According to a tenth aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of sequentially forming a first insulating film and a first conductive film on the semiconductor substrate and etching the first conductive film in the capacitor region to form a lower electrode having an increased surface area; a third step of sequentially removing the first conductive film and the first insulating film in the storage circuit region and the logic circuit region; a fourth step of sequentially forming a second insulating film, a third insulating film and a second conductive film on the semiconductor substrate including the lower electrode; a fifth step of forming in the storage circuit region a charge storage film from the second insulating film and the third insulating film and a first gate electrode from the second conductive film; a sixth step of forming in the logic circuit region a gate insulating film from the second insulating film and the third insulating film and a second gate electrode from the second conductive film; and a seventh step of forming in the capacitor region a capacitor capacitance insulating film from the second insulating film and the third insulating film and an upper electrode from the second conductive film.

In the manufacturing method of the tenth aspect, the lower electrode is formed from a conductive film. Therefore, the lower electrode is less likely to be subjected to depletion as compared to the case where the semiconductor substrate is used for the lower electrode. As a result, stable capacitor characteristics can be obtained. Moreover, since the step of forming the storage element, the step of forming the logic element and the step of forming the capacitor are partially conducted in the same process, the manufacturing costs are not increased. Moreover, the gate insulating film is a lamination of the second insulating film and the third insulating film. This enables formation of a reliable logic element.

In the fourth step of the manufacturing method of the tenth aspect, the third insulating film is preferably formed by nitriding an upper portion of the second insulating film.

In the fourth step of the manufacturing method of the tenth aspect, the third insulating film is preferably formed by depositing a silicon nitride film on the second insulating film. Since the first conductive film is covered with the silicon nitride film, the shape of the lower electrode is less likely to be varied. Accordingly, degradation of the capacitor capacitance insulating film can be suppressed.

In the manufacturing method of the tenth aspect, the second insulating film is preferably a silicon oxide film. This enables improvement in reliability of the charge storage film, the gate insulating film and the capacitor capacitance insulating film.

According to an eleventh aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of sequentially forming a first insulating film and a first conductive film on the semiconductor substrate and etching the first conductive film in the capacitor region to form a lower electrode having an increased surface area; a third step of sequentially removing the first conductive film and the first insulating film in the storage circuit region and the logic circuit region; a fourth step of forming a second insulating film on the semiconductor substrate including the lower electrode; a fifth step of removing the second insulating film included in the logic circuit region; a sixth step of sequentially depositing a third insulating film, a fourth insulating film and a second conductive film on an exposed surface of the semiconductor substrate in the logic circuit region and on the second insulating film in the storage circuit region and the capacitor region; a seventh step of forming in the storage circuit region a charge storage film from the second insulating film, the third insulating film and the fourth insulating film and a first gate electrode from the second conductive film; an eighth step of forming in the logic circuit region a gate insulating film from the third insulating film and the fourth insulating film and a second gate electrode from the second conductive film; and a ninth step of forming in the capacitor region a capacitor capacitance insulating film from the second insulating film, the third insulating film and the fourth insulating film and an upper electrode from the second conductive film.

In the manufacturing method of the eleventh aspect, the lower electrode is formed from a conductive film. Therefore, the lower electrode is less likely to be subjected to depletion as compared to the case where the semiconductor substrate is used for the lower electrode. As a result, stable capacitor characteristics can be obtained. Moreover, since the step of forming the storage element, the step of forming the logic element and the step of forming the capacitor are partially conducted in the same process, the manufacturing costs are not increased. Moreover, the gate insulating film is a lamination of the third insulating film and the fourth insulating film. This enables improvement in reliability of the gate insulating film.

In the manufacturing method of the eleventh aspect, each of the second insulating film and the third insulating film is preferably a silicon oxide film. This enables improvement in reliability of the charge storage film, the gate insulating film and the capacitor capacitance insulating film.

In the manufacturing method of the eleventh aspect, the fourth insulating film is preferably a silicon nitride film. This enables improvement in reliability of the charge storage film, the gate insulating film and the capacitor capacitance insulating film.

According to a twelfth aspect of the present invention, a method for manufacturing a non-volatile semiconductor memory device includes: a first step of forming an element isolation insulating film in a semiconductor substrate in order to define a storage circuit region, a logic circuit region and a capacitor region; a second step of sequentially forming a first insulating film and a first conductive film on the semiconductor substrate and etching the first conductive film in the capacitor region to form a lower electrode having an increased surface area; a third step of sequentially removing the first conductive film and the first insulating film which are included in the storage circuit region and the logic circuit region; a fourth step of sequentially forming a second insulating film and a third insulating film on the semiconductor substrate including the lower electrode; a fifth step of sequentially removing the third insulating film and the second insulating film which are included in the logic circuit region; a sixth step of sequentially depositing a fourth insulating film and a second conductive film on an exposed surface of the semiconductor substrate in the logic circuit region and on the third insulating film in the storage circuit region and the capacitor region; a seventh step of forming in the storage circuit region a charge storage film from the second insulating film, the third insulating film and the fourth insulating film and a first gate electrode from the second conductive film; an eighth step of forming in the logic circuit region a gate insulating film from the fourth insulating film and a second gate electrode from the second conductive film; and a ninth step of forming in the capacitor region a capacitor capacitance insulating film from the second insulating film, the third insulating film and the fourth insulating film and an upper electrode from the second conductive film.

In the manufacturing method of the twelfth aspect, the lower electrode is formed from a conductive film. Therefore, the lower electrode is less likely to be subjected to depletion as compared to the case where the semiconductor substrate is used for the lower electrode. As a result, stable capacitor characteristics can be obtained. Moreover, since the step of forming the storage element, the step of forming the logic element and the step of forming the capacitor are partially conducted in the same process, the manufacturing costs are not increased. Moreover, the gate insulating film is formed only from the fourth insulating film. This facilitates reduction in thickness of the gate insulating film.

In the manufacturing method of the twelfth aspect, each of the second insulating film and the fourth insulating film is preferably a silicon oxide film. This enables improvement in reliability of the charge storage film, the gate insulating film and the capacitor capacitance insulating film.

In the manufacturing method of the twelfth aspect, the third insulating film is preferably a silicon nitride film. This enables improvement in reliability of the charge storage film and the capacitor capacitance insulating film.

In the second step of the manufacturing methods of the ninth to twelfth aspects, the lower electrode is preferably formed into a plurality of holes, a plurality of island-shaped lower electrode portions, or a plurality of stripe-shaped lower electrode portions.

In the second step of the manufacturing methods of the ninth to twelfth aspects, the lower electrode is preferably formed into a plurality of concavities, a plurality of convexities, or a plurality of stripe-shaped convexities.

BRIEF DESCRIPTION OF THE DRAWINGS

FIGS. 2A, 2B and 2C show a lower electrode of a capacitor according to the first embodiment of the present invention, wherein FIG. 2A is a perspective view showing a first shape, FIG. 2B is a perspective view showing a second shape, and FIG. 2C is a perspective view showing a third shape;

FIGS. 6A and 6B are cross-sectional views sequentially illustrating the steps of the method for manufacturing a non-volatile semiconductor memory device according to the first embodiment of the present invention;

FIGS. 7A and 7B are cross-sectional views sequentially illustrating the steps of the method for manufacturing a non-volatile semiconductor memory device according to the first embodiment of the present invention;

FIGS. 9A and 9B are cross-sectional views sequentially illustrating the steps of a method for manufacturing a non-volatile semiconductor memory device according to a modification of the first embodiment of the present invention;

FIGS. 16A and 16B are cross-sectional views sequentially illustrating the steps of a method for manufacturing a non-volatile semiconductor memory device according to the fourth embodiment of the present invention;

FIGS. 18A and 18B are cross-sectional views sequentially illustrating the steps of a method for manufacturing a non-volatile semiconductor memory device according to the fifth embodiment of the present invention;

FIGS. 20A and 20B are cross-sectional views sequentially illustrating the steps of a method for manufacturing a non-volatile semiconductor memory device according to the sixth embodiment of the present invention;

DESCRIPTION OF THE PREFERRED EMBODIMENTS (First Embodiment)

Hereinafter, the first embodiment of the present invention will be described with reference to the accompanying drawings.

Figure 1:
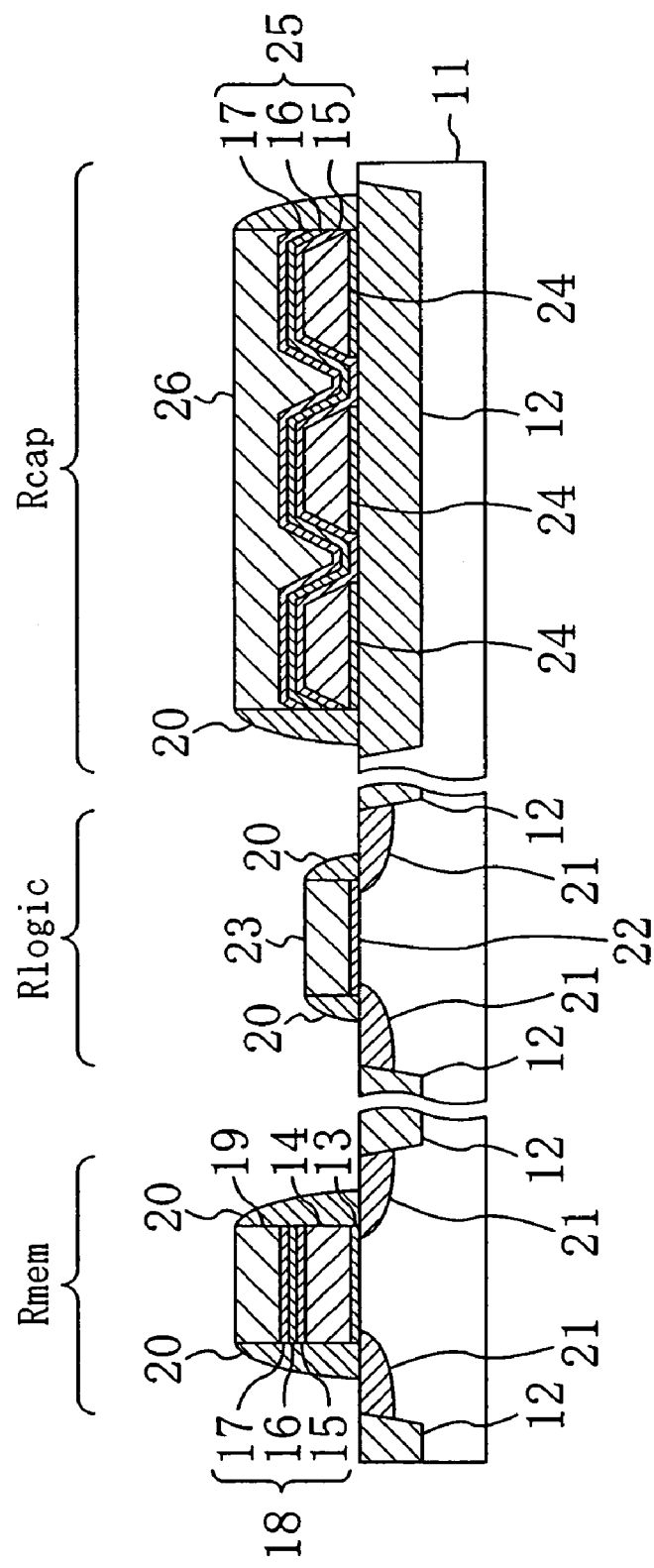
FIG. 1 is a cross-sectional view of a non-volatile semiconductor memory device according to a first embodiment of the present invention.

FIG. 1 shows a cross-sectional structure of a non-volatile semiconductor memory device according to the first embodiment of the present invention. As shown in FIG. 1, an element isolation insulating film 12 is selectively formed in the upper portion of a semiconductor substrate 11. The semiconductor substrate 11 is formed from silicon, and the element isolation insulating film 12 is formed from silicon oxide. Such selective formation of the element isolation insulating film 12 defines a storage circuit region Rmem, a logic circuit region Rlogic, and a capacitor region Rcap. The storage circuit region Rmem is a region including a storage element. The logic circuit region Rlogic is a region including a peripheral circuit or a logic element such as a logic circuit. The capacitor region Rcap is a region including a capacitor of a booster which is formed on the element isolation insulating film 12.

In the storage circuit region Rmem, a floating gate electrode 14 is formed on the semiconductor substrate 11 with a tunnel insulating film 13 interposed therebetween. The tunnel insulating film 13 is formed from silicon oxide, and the floating gate electrode 14 is formed from polysilicon. A control gate electrode 19 is formed on the floating gate electrode 14 with a storage element capacitance insulating film (a capacitance insulating film for a storage element) 18 interposed therebetween. The storage element capacitance insulating film 18 is an ONO (oxide-nitride-oxide) film, and the control gate electrode 19 is formed from polysilicon.

Note that the storage element capacitance insulating film 18 is a lamination of a first silicon oxide film 15, a silicon nitride film 16 and a second silicon oxide film 17.

A sidewall 20 is formed on both sides of the floating gate electrode 14 and the control gate electrode 19. The sidewall 20 is formed from silicon oxide. A source/drain region 21 is formed in the surface region of the semiconductor substrate 11 so as to extend from a position inside the sidewall 20 to a position outside the sidewall 20. The source/drain region 21 is formed by introducing impurities into the semiconductor substrate 11.

In the logic circuit region Rlogic, a gate electrode 23 is formed on the semiconductor substrate 11 with a gate insulating film 22 interposed therebetween. The gate insulating film 22 is formed from silicon oxide, and the gate electrode 23 is formed from polysilicon. A sidewall 20 is formed on both sides of the gate electrode 23. The sidewall 20 is formed from silicon oxide. A source/drain region 21 is formed in the surface region of the semiconductor substrate 11 so as to extend from a position inside the sidewall 20 to a position outside the sidewall 20. The source/drain region 21 is formed by introducing impurities into the semiconductor substrate 11.

In the capacitor region Rcap, a lower electrode 24 is formed on the element isolation insulating film 12 with an insulating film interposed therebetween. This insulating film is the same as the tunnel insulating film 13 in the storage circuit region Rmem. The lower electrode 24 is formed from polysilicon. More specifically, the lower electrode 24 is formed by shaping a plate-like conductive film of polysilicon. An upper electrode 26 is formed on the lower electrode 24 with a capacitor capacitance insulating film (a capacitance insulating film for a capacitor) 25 interposed therebetween. The capacitor capacitance insulating film 25 is an ONO film, and the upper electrode 26 is formed from polysilicon. The capacitor capacitance insulating film 25 is a lamination of a first silicon oxide film 15, a silicon nitride film 16 and a second silicon oxide film 17. Note that the capacitor capacitance insulating film 25 may alternatively be a single-layer film.

In the non-volatile semiconductor memory device of the first embodiment, the floating gate electrode 14 in the storage circuit region Rmem and the lower electrode 24 in the capacitor region Rcap are preferably formed from a conductive film which is formed in the same step. The storage element capacitance insulating film 18 in the storage circuit region Rmem and the capacitor capacitance insulating film 25 in the capacitor region Rcap are preferably formed from an insulating film which is formed in the same step. Moreover, the control gate electrode 19 in the storage circuit region Rmem, the gate electrode 23 in the logic circuit region Rlogic and the upper electrode 26 in the capacitor region Rcap are preferably formed from a conductive film which is formed in the same step. This enables the step of forming the storage element and the step of forming the capacitor to be partially conducted in the same process.

The lower electrode 24 of the capacitor of the first embodiment is formed by shaping a plate-like conductive film so as to increase the surface area. More specifically, the lower electrode 24 is formed as follows: a plate-like conductive film having a height of about 200 nm is formed in a square region of about 200 µm×about 200 µm and is shaped so as to have an increased surface area. This enables the capacitance of the capacitor to be increased without increasing the area of the capacitor. As a result, a capacitor which enables reduction in voltage of a non-volatile semiconductor memory device without impeding reduction in size of the non-volatile semiconductor memory device can be obtained.

Hereinafter, specific shapes of the lower electrode of the capacitor will be described.

FIGS. 2A to 2C and FIGS. 3A to 3C are perspective views of the lower electrode of the capacitor, and show specific examples of the shape of the lower electrode. Note that, in FIGS. 2B and 2C, a square region defined by dashed line is a region where the capacitor is to be formed (hereinafter, referred to as "capacitor formation region"). The size of this square region is about 200 µm×about 200 µm.

Figure 2A:
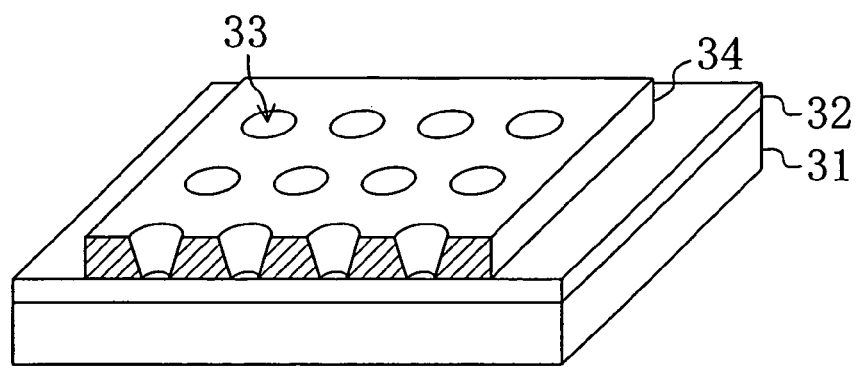

FIG. 2A is a perspective view showing a first shape of the lower electrode. The lower electrode 34 having the first shape is formed as follows: a plate-like conductive film is formed on the element isolation insulating film 32 of the semiconductor substrate 31, and a plurality of holes 33 are formed in the plate-like conductive film. Each hole 33 has a diameter of about 0.3 µm, and extends through the lower electrode 34 down to the element isolation insulating film 32. Note that the holes do not necessarily have a circular shape (a square shape in design), and may have an oval or elliptical shape (a rectangular shape in design).

Figure 2B:
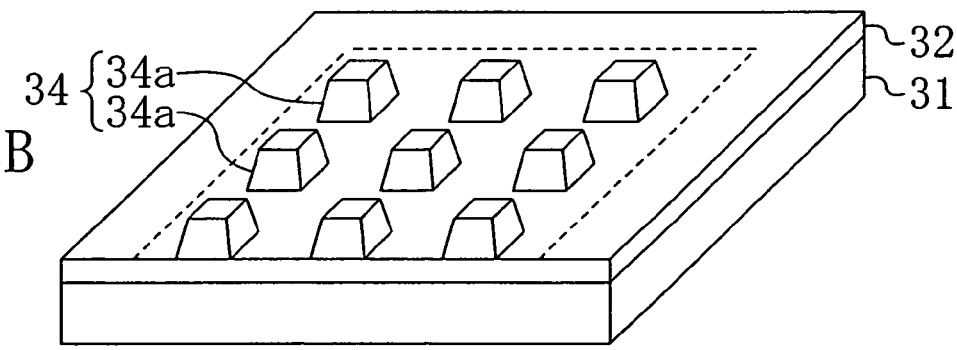

FIG. 2B is a perspective view showing a second shape of the lower electrode. The lower electrode 34 having the second shape is formed as follows: a plate-like conductive film is formed on the element isolation insulating film 32 of the semiconductor substrate 31, and is patterned into a plurality of island-shaped lower electrode portions 34a arranged in a matrix. For example, each lower electrode portion 34a has a square size of about 20 µm×about 20 µm, and the lower electrode portions 34a are arranged at intervals of about 0.3 µm. The height of the lower electrode portions 34a is the same as the thickness of the plate-like conductive film.

Although not shown in the figure, a wiring for electrically connecting the lower electrode portions 34a to each other is formed in order to allow the island-shaped lower electrode portions 34a to function as the lower electrode 34 of a single capacitor. For example, this wiring can be formed as follows: after the upper electrode is formed, holes extending to the respective lower electrode portions 34a are formed in the upper electrode, and a metal wiring is formed so as to connect the lower electrode portions 34a to each other.

Figure 2C:
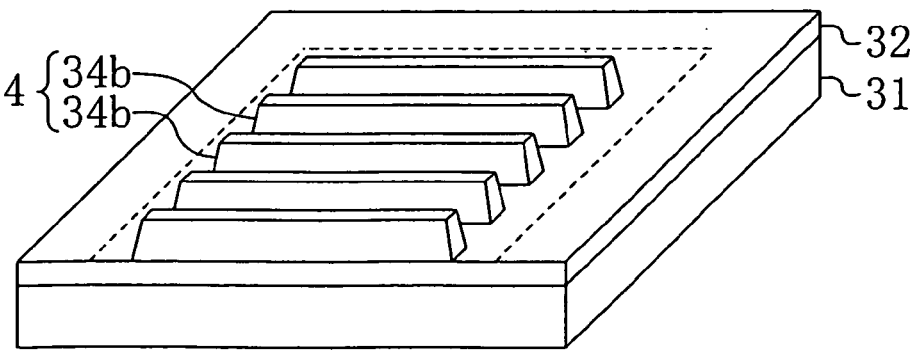

FIG. 2C is a perspective view showing a third shape of the lower electrode. The lower electrode 34 having the third shape is formed as follows: a plate-like conductive film is formed on the element isolation insulating film 32 of the semiconductor substrate 31, and is patterned into stripe-shaped lower electrode portions 34b. For example, each stripe-shaped lower electrode portion 34b has a width of about 0.25 µm, and the lower electrode portions 34b are arranged at intervals of about 0.25 µm. The height of the lower electrode portions 34b is the same as the thickness of the plate-like conductive film.

Although not shown in the figure, a wiring for electrically connecting the lower electrode portions 34b to each other is formed in order to allow the stripe-shaped lower electrode portions 34b to function as the lower electrode 34 of a single capacitor. For example, this wiring can be formed as follows: the lower electrode portions 34b are formed so that the ends of the lower electrode portions 34b are exposed from the region of the upper electrode, and a metal wiring is formed so as to connect the exposed portions of the lower electrode portions 34b to each other. This connection may be implemented by the lower electrode itself instead of the wiring. The lower electrode portions 34b may alternatively be connected in the same manner as that of the second shape. More specifically, after the upper electrode is formed, holes extending to the respective lower electrode portions 34b are formed in the upper electrode, and a metal wiring is formed so as to connect the lower electrode portions 34b to each other.

In the lower electrode 34 of the first shape, each hole 33 reaches the element isolation insulating film 32. Moreover, in the lower electrodes 34 of the second and third shapes, the element isolation insulating film 32 around the lower electrode portions 34a, 34b is exposed to the outside. In order for the lower electrode 34 to have a greater surface area than that of a plate-like lower electrode, the total area of the side surfaces of the holes 33 or the lower electrode portions 34a, 34b must be greater than the area of the region of the top surface of the plate-like conductive film, which is removed by forming the holes 33 or the lower electrode portions 34a, 34b. More specifically, for the lower electrode having the third shape, the distance S between the stripe-shaped lower electrode portions 34b and the thickness T of the lower electrode 34 has the relation of $S \leq 2T$.

Hereinafter, modifications of the first to third shapes of the lower electrode will be described.

Figure 3A:
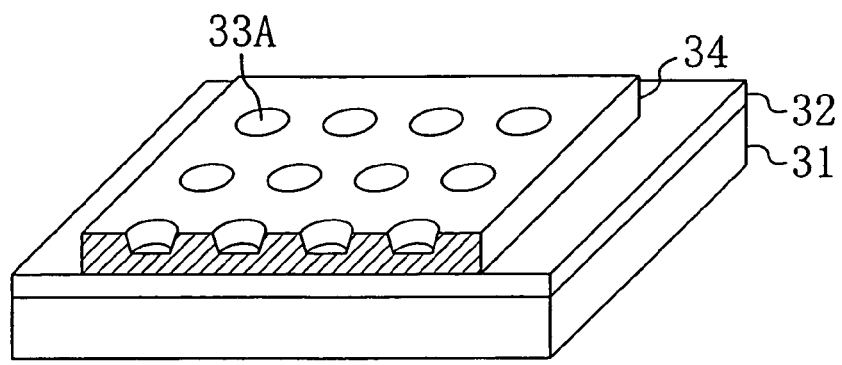
FIGS. 3A, 3B and 3C are perspective views of a lower electrode of a capacitor according to a modification of the first embodiment of the present invention, wherein FIGS. 3A, 3B and 3C correspond to FIGS. 2A, 2B and 2C, respectively.
Figure 3B:
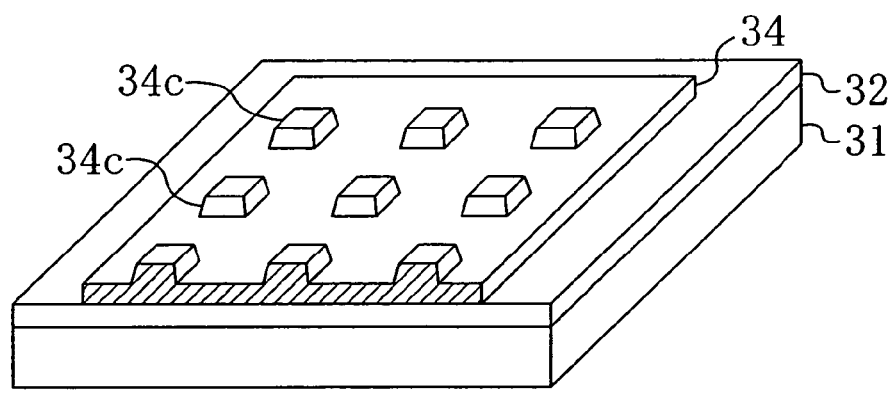
Figure 3C:
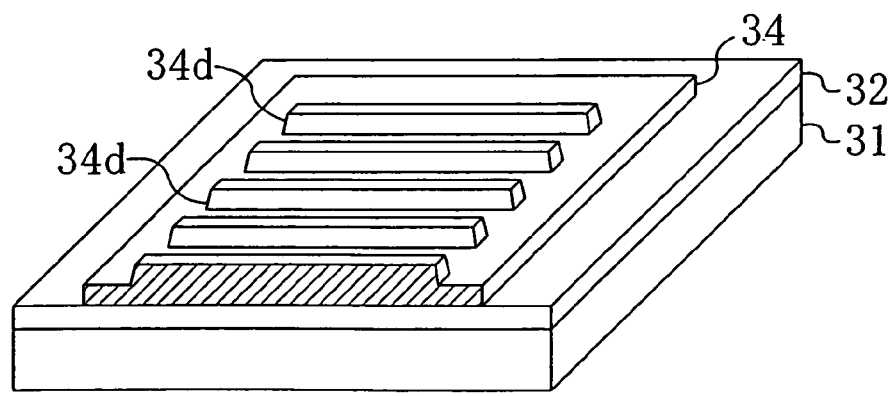

FIGS. 3A to 3C are perspective views showing modifications of the first to third shapes of the lower electrode 34. In the lower electrodes 34 of these modifications, the upper portion of the plate-like conductive film has the same two-dimensional shape as that of the holes 33 or the lower electrode portions 34a, 34b in the lower electrode 34 of the first to third shapes.

FIG. 3A is a perspective view showing a modification of the first shape of the lower electrode. In this modification, the upper portion of the plate-like conductive film formed on the element isolation insulating film 32 of the semiconductor substrate 31 has the same two-dimensional shape as that in the first shape. More specifically, a plurality of concavities 33A are formed in the upper portion of the plate-like conductive film.

FIG. 3B is a perspective view showing a modification of the second shape of the lower electrode. In this modification, the upper portion of the plate-like conductive film formed on the element isolation insulating film 32 of the semiconductor substrate 31 has the same two-dimensional shape as that in the second shape. More specifically, a plurality of convexities 34c are formed in the upper portion of the plate-like conductive film. The lower electrode 34 of this modification has the convexities 34c in its upper portion, and the lower portion of the lower electrode 34 is not separated. Therefore, unlike the lower electrode of the second shape, the lower electrode of this modification does not require a wiring for connecting the convexities 34c to each other. Note that the two-dimensional shape of each convexity 34c is not limited to the square.

FIG. 3C is a perspective view showing a modification of the third shape of the lower electrode. In this modification, the upper portion of the plate-like conductive film formed on the element isolation insulating film 32 of the semiconductor substrate 31 has the same two-dimensional shape as that in the third embodiment. More specifically, a plurality of stripe-shaped convexities 34d are formed in the upper portion of the plate-like conductive film. The lower electrode 34 of this modification has the stripe-shaped convexities 34d in its upper portion, and the lower portion of the lower electrode 34 is not separated. Therefore, unlike the lower electrode of the third shape, the lower electrode of this modification does not require a wiring for connecting the convexities 34d to each other.

The modifications of the first to third shapes are characterized in that the concavities 33A does not extend through the lower electrode, and the element isolation insulating film 32 around the convexities 34c, 34d are not exposed to the outside. Therefore, unlike the first to third shapes, the surface area of the lower electrode 34 is not reduced but always increased by forming the convexities 33A or the convexities 34c, 34d.

According to the first to third shapes of the lower electrode and the modifications thereof, the capacitance can be easily increased even in such a large capacitor that is used in a booster. More specifically, the capacitance of the capacitor can be easily increased while retaining the same area as that of the conventional capacitor and without using a special insulating film.

Hereinafter, the cross-sectional shape of the concavity in the first to third shapes of the lower electrode and the modifications thereof will be described.

Figure 4A:
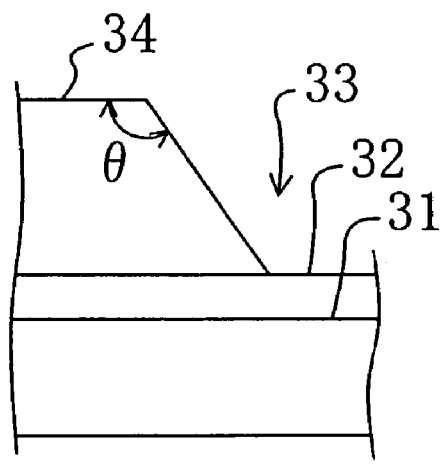
FIGS. 4A and 4B are cross-sectional views showing a part of a lower electrode of a capacitor according to the first embodiment of the present invention.
Figure 4B:
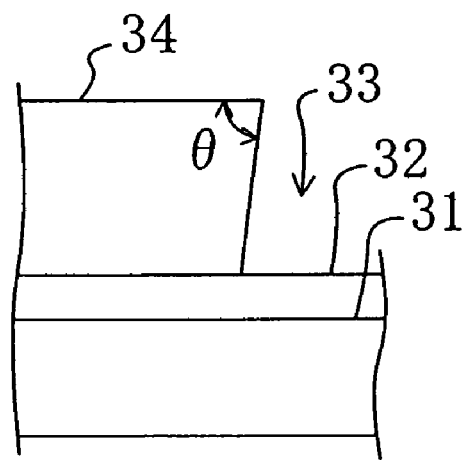

FIGS. 4A and 4B show a part of the lower electrode having the first shape. More specifically, FIGS. 4A and 4B show a transverse cross section of the concavity formed in the lower electrode. As shown in FIG. 4A, the angle θ between the side surface of the concavity 33 and the top surface of the lower electrode 34 is preferably 90 degrees or more. The angle θ of less than 90 degrees as shown in FIG. 4B would degrade coverage of the insulating film formed on the lower electrode. As a result, the insulating film is more likely to be "lifted" or "separated" from the lower electrode, and the insulating film has a reduced thickness at the corners. This causes reduction in reliability of the insulating film.

Although the lower electrode 34 having the first shape is described above, the same applies to the other shapes. In other words, in the lower electrode 34 of the capacitor of the first embodiment, the angle between the side surface of the concavity formed in the lower electrode 34 and the top surface of the lower electrode 34 is preferably 90 degrees or more. This improves reliability of the capacitance insulating film formed on the lower electrode.

Regarding the lower electrodes of the first to third shapes, a voltage V1 of the upper electrode and a voltage V2 of the lower electrode preferably has the relation of V1<V2. The reason for this is as follows: in the lower electrodes of the first to third shapes, the capacitance insulating film between the upper and lower electrodes projects toward the lower electrode. Therefore, if V1>V2, an electric field would be intensively applied to the convexities of the lower electrode, thereby degrading reliability of the capacitance insulating film. Accordingly, in the lower electrodes of the first to third shapes, the use of the voltages V1, V2 having the relation of V1>V2 can improve reliability of the capacitance insulating film over the relation of V1<V2. Note that, in the modifications of the first to third shapes of the lower electrode, the upper electrode has convexities like the lower electrode. Therefore, the above condition does not apply to the modifications of the first to third shapes.

(Manufacturing Method of First Embodiment)

Hereinafter, a method for manufacturing the above non-volatile semiconductor memory device will be described with reference to the figures.

Figure 5A:
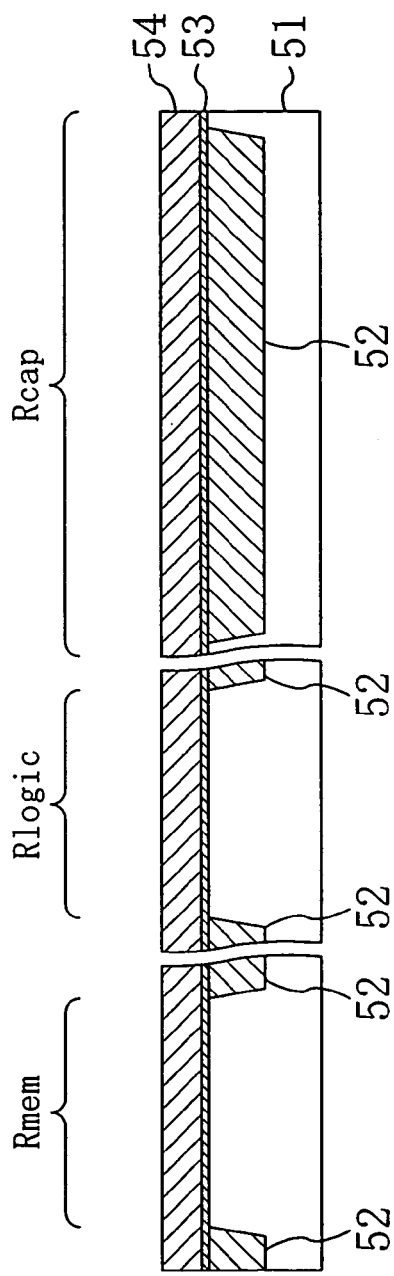
FIGS. 5A and 5B are cross-sectional views sequentially illustrating the steps of a method for manufacturing a non-volatile semiconductor memory device according to the first embodiment of the present invention.

FIGS. 5A to 8 are cross-sectional views sequentially illustrating the steps of a method for manufacturing a semiconductor memory device according to the first embodiment of the present invention. As shown in FIG. 5A, an element isolation insulating film 52 is formed in a semiconductor substrate 51 by an STI (Shallow Trench Isolation) method in order to define a storage circuit region Rmem and a logic circuit region Rlogic which are electrically isolated from each other, and to define a capacitor region Rcap. In the capacitor region Rcap, a booster is to be formed on the element isolation insulating film 52. A first insulating film 53 is then formed on the whole surface of the semiconductor substrate 51 including the element isolation insulating film 52 by a thermal oxidation method. Thereafter, a first conductive film 54 having a thickness of about 200 nm is deposited on the first insulating film 53 by a CVD (Chemical Vapor Deposition) method. The first insulating film 53 is formed from silicon oxide, and the first conductive film 54 is formed from polysilicon.

Note that the element isolation insulating film 52 may be formed by a LOCOS (Local Oxidation of Silicon) method instead of the STI method.

Figure 5B:
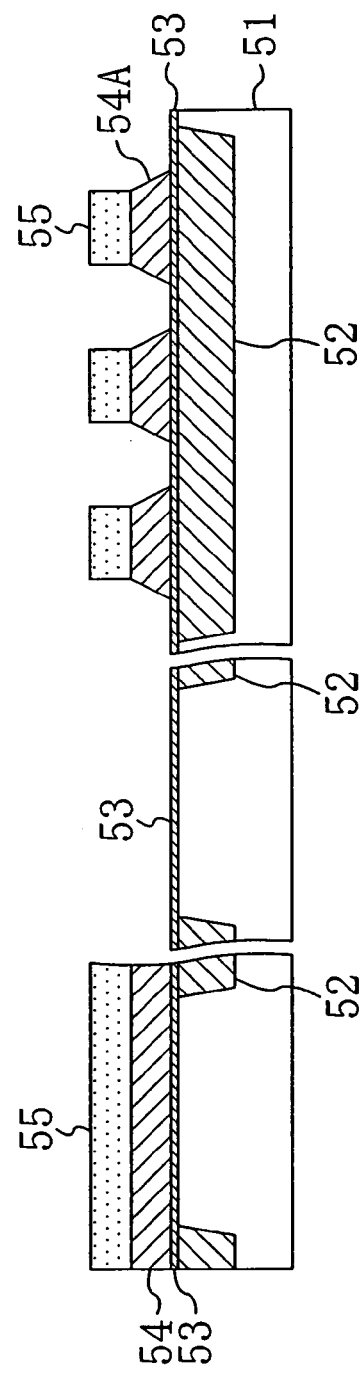

As shown in FIG. 5B, a first resist pattern 55 is then formed by a photolithography method. The first resist pattern 55 exposes the logic circuit region Rlogic and the capacitor region Rcap other than the capacitor formation region, and has openings of a predetermined shape in the capacitor formation region. Thereafter, by using the first resist pattern 55 as a mask, the first conductive film 54 is etched by an anisotropic dry etching method using, e.g., $CF_2$ and HBr as etching gas. More specifically, the first conducive film 54 in the logic circuit region Rlogic and the exposed portion of the first conductive film 54 in the capacitor region Rcap are etched away. As a result, a lower electrode 54 having a predetermined shape is formed in the capacitor region Rcap.

If the first resist pattern 55 has hole-shaped openings in the capacitor formation region of the capacitor region Rcap, the resultant lower electrode has the first shape. If the first resist pattern 55 has grid-like openings in the capacitor formation region of the capacitor region Rcap, the resultant lower electrode has the second shape. If the first resist pattern 55 has stripe-shaped openings in the capacitor formation region of the capacitor region Rcap, the resultant lower electrode has the third shape. Such a resist pattern can be effectively formed by a photolithography method using annular illumination or a phase shift mask.

Although not shown in the figure, the lower electrodes of the capacitor according to the modifications of the first to third shapes can be formed by, e.g., the following method: the above anisotropic dry etching process using the first resist pattern 55 as a mask is conducted for a reduced time so that only the upper portion of the first conductive film 54 is etched away. The first resist pattern 55 is then removed. Thereafter, a resist pattern is formed so as to expose the logic circuit region Rlogic and mask the capacitor formation region of the capacitor region Rcap. The first conductive film 54 in the logic circuit region Rlogic, i.e., the exposed portion of the first conductive film 54, is then etched away by a dry etching method using this resist pattern as a mask.

As shown in FIG. 6A, the first resist pattern 55 is removed, and the first insulating film 53 in the logic circuit region Rlogic and the exposed portion of the first insulating film 53 in the capacitor region Rcap are removed by a wet etching method. Thereafter, a first silicon oxide film 56 and a silicon nitride film 57 are sequentially deposited on the whole surface of the semiconductor substrate 51 by a reduced pressure CVD method. An ON (oxide-nitride) film 58 is thus formed as a second insulating film.

As shown in FIG. 6B, a second resist pattern 59 exposing the logic circuit region Rlogic is then formed by a photolithography method. By using the second resist pattern 59 as a mask, the ON film 58 in the logic circuit region Rlogic is then etched away by an anisotropic dry etching method using, e.g., $CF_2$ as etching gas.

As shown in FIG. 7A, the second resist pattern 59 is removed, and a second silicon oxide film 60 is formed as a third insulating film on the semiconductor substrate 51 in the logic circuit region Rlogic and on the silicon nitride film 57 in the storage circuit region Rmem and the capacitor region Rcap by a thermal oxidation method. An ONO film 61, a lamination of the first silicon oxide film 56, the silicon nitride film 57 and the second silicon oxide film 60, is thus formed on the first conductive film 54 in the storage circuit region Rmem and on the lower electrode 54A in the capacitor region Rcap. Thereafter, a second conductive film 62 having a thickness of about 200 nm is deposited on the second silicon oxide film 60 by a reduced pressure CVD method. The second conductive film 62 is formed from polysilicon. A third resist pattern 63 for patterning a region where a control gate electrode is to be formed (hereinafter, referred to as "control gate electrode formation region") in the storage circuit region Rmem and masking the logic circuit region Rlogic and the capacitor region Rcap is then formed by a photolithography method. Thereafter, by an anisotropic dry etching method using the third resist pattern 63 as a mask, the first insulating film 53, the first conductive film 54, the ONO film 61 and the second conductive film 62 are etched in the storage circuit region Rmem to form a tunnel insulating film 53A, a floating gate electrode 54B, a storage element capacitance insulating film 61A and a control gate electrode 62A, respectively.

As shown in FIG. 7B, a fourth resist pattern 64 is then formed by a photolithography method. The fourth resist pattern 64 masks the storage circuit region Rmem, a region where a gate electrode is to be formed (hereinafter, referred to as "gate electrode formation region") in the logic circuit region Rlogic, and the capacitor formation region in the capacitor region Rcap. An anisotropic dry etching method is then conducted using the fourth resist pattern 64 as a mask. As a result, in the logic circuit region Rlogic, the second conductive film 62 and the second silicon oxide film 60 are etched to form a gate electrode 62B and a gate insulating film 60A, respectively. Moreover, in the capacitor region Rcap, the ONO film 61 and the second conductive film 62 are etched to form a capacitor capacitance insulating film 61B and an upper electrode 62C, respectively.

Figure 8:
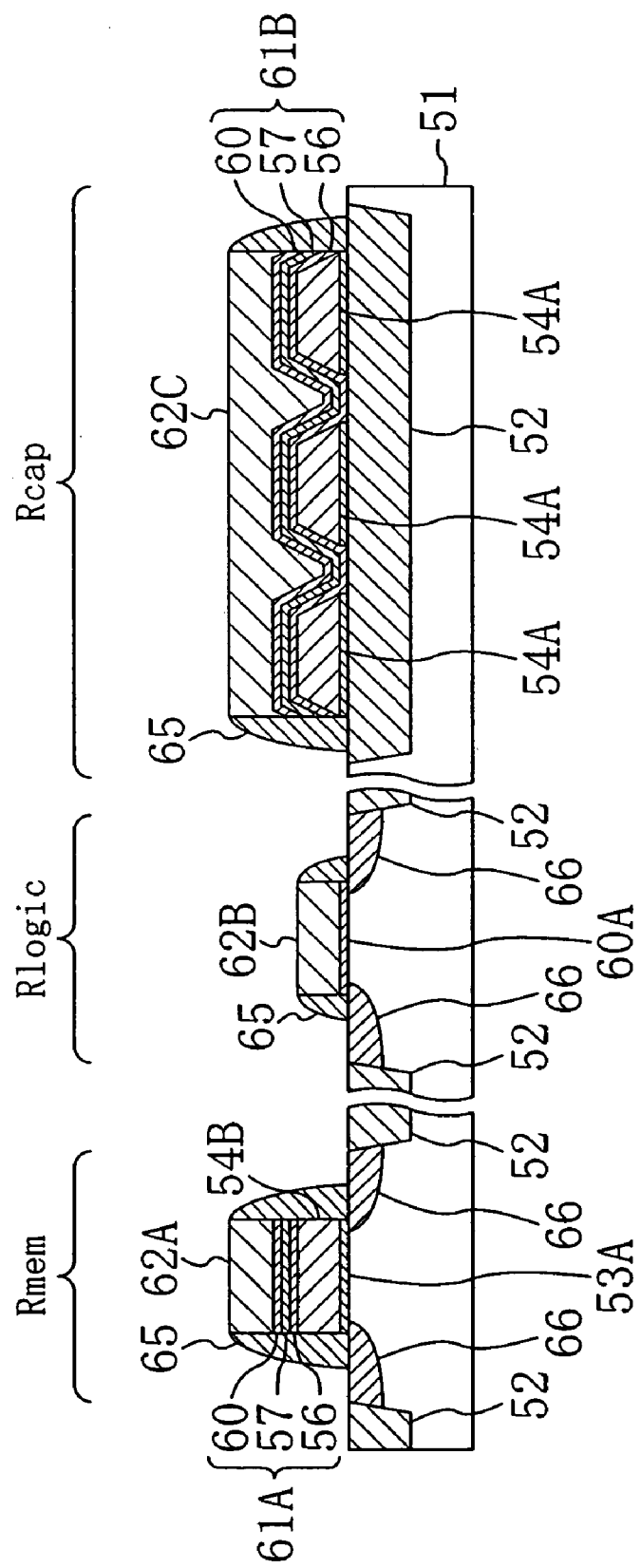
FIG. 8 is a cross-sectional view sequentially illustrating the steps of the method for manufacturing a non-volatile semiconductor memory device according to the first embodiment of the present invention.

As shown in FIG. 8, the fourth resist pattern 64 is then removed, and an insulating film for forming a sidewall is formed. The insulating film for forming a sidewall is then subjected to an anisotropic dry etching method in order to form a sidewall 65 on the side surfaces of a storage element, a logic element and a capacitor in a self-aligned manner. Impurities are then introduced into the semiconductor substrate 51 by using the sidewalls 65 as a mask. As a result, a source/drain region 66 extending to a position outside the storage element and the logic element is formed in the semiconductor substrate 51.

Although not shown in the figure, the steps of forming an interlayer insulating film, forming a wiring, and forming bonding pads are then conducted, whereby the non-volatile semiconductor memory device of the first embodiment is completed.

(Modification of Manufacturing Method of First Embodiment)

Hereinafter, a modification of the above method for manufacturing a non-volatile semiconductor memory device according to the first embodiment of the present invention will be described with reference to the figures. The modification is different from the above manufacturing method in a process of removing the first insulating film, the first conductive film and the ON film in the logic circuit region.

Figure 10:
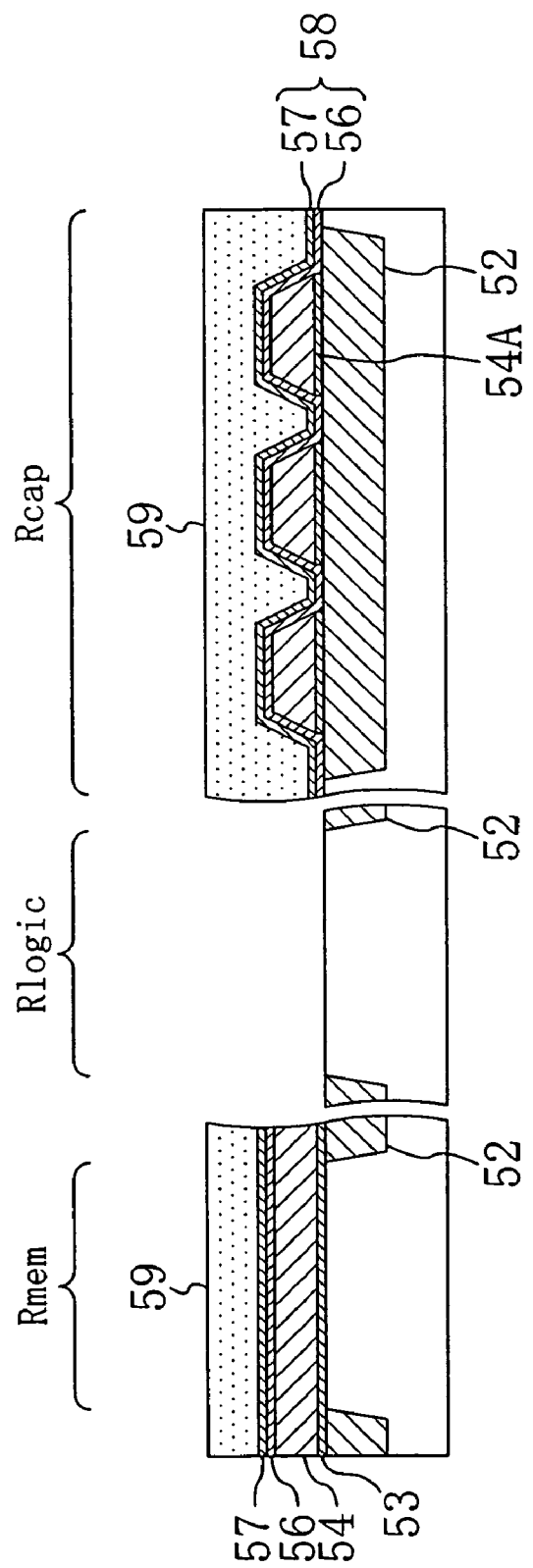
FIG. 10 is a cross-sectional view sequentially illustrating the steps of the method for manufacturing a non-volatile semiconductor memory device according to the modification of the first embodiment of the present invention.

FIGS. 9A, 9B and 10 are cross-sectional views sequentially illustrating the steps of the method for manufacturing a non-volatile semiconductor memory device according to the modification. Some steps in the modification can be conducted in the same manner as that of the above manufacturing method. Therefore, detailed description thereof is omitted. Moreover, the same members as those in the above manufacturing method are denoted with the same reference numerals and characters, and description thereof is omitted.

The element isolation insulating film 52 is formed in the semiconductor substrate 51 in the same manner as that in the step of FIG. 5A in order to define the storage circuit region Rmem, the logic circuit region Rlogic and the capacitor region Rcap. Thereafter, the first insulating film 53 and the first conductive film 54 are formed.

As shown in FIG. 9A, a first resist pattern 67 for masking the storage circuit region Rmem and the logic circuit region Rlogic and patterning a lower electrode of a capacitor in the capacitor region Rcap is formed by a photolithography method. By using the first resist pattern 67 as a mask, the first conductive film 54 is etched by an anisotropic dry etching method using, e.g., $CF_2$ and HBr as etching gas. A lower electrode 54A is thus formed in the capacitor region Rcap.

As shown in FIG. 9B, the first resist pattern 67 is then removed, and a first silicon oxide film 56 and a silicon nitride film 57 are sequentially deposited on the whole surface of the semiconductor substrate 51 by a reduced pressure CVD method.

As shown in FIG. 10, a second resist pattern 59 masking the storage circuit region Rmem and the capacitor region Rcap and exposing the logic circuit region Rlogic is formed by a photolithography method. By using the second resist pattern 59 as a mask, the first silicon oxide film 56 and the silicon nitride film 57 in the logic circuit region Rlogic are etched by an anisotropic dry etching method using, e.g., $CF_2$ as etching gas. By using the second resist pattern 59 as a mask, the first conductive film 54 in the logic circuit region Rlogic is etched away by an anisotropic dry etching method using, e.g., $CF_2$ and HBr as etching gas, and the first insulating film 53 in the logic circuit region Rlogic is also etched away by a wet etching method.

Thereafter, the steps shown FIG. 7A and the following figures are conducted, whereby the non-volatile semiconductor memory device according to the first embodiment is completed.

As has been described above, in the manufacturing method of the non-volatile semiconductor memory device according to the first embodiment and the modification thereof, the lower electrode 54A of the capacitor and the floating gate electrode 54B of the storage element are formed from a conductive film which is deposited in the same step. Moreover, the upper electrode 62C of the capacitor and the control gate electrode 62A of the storage element are formed from a conductive film which is deposited in the same step, and the capacitor capacitance insulating film 61B and the storage element capacitance insulating film 61A are formed from an insulating film which is formed in the same step. This enables a capacitor having a great capacitance to be formed without increasing the manufacturing costs.

(Second Embodiment)

Hereinafter, the second embodiment of the present invention will be described with reference to the figures.

Figure 11:
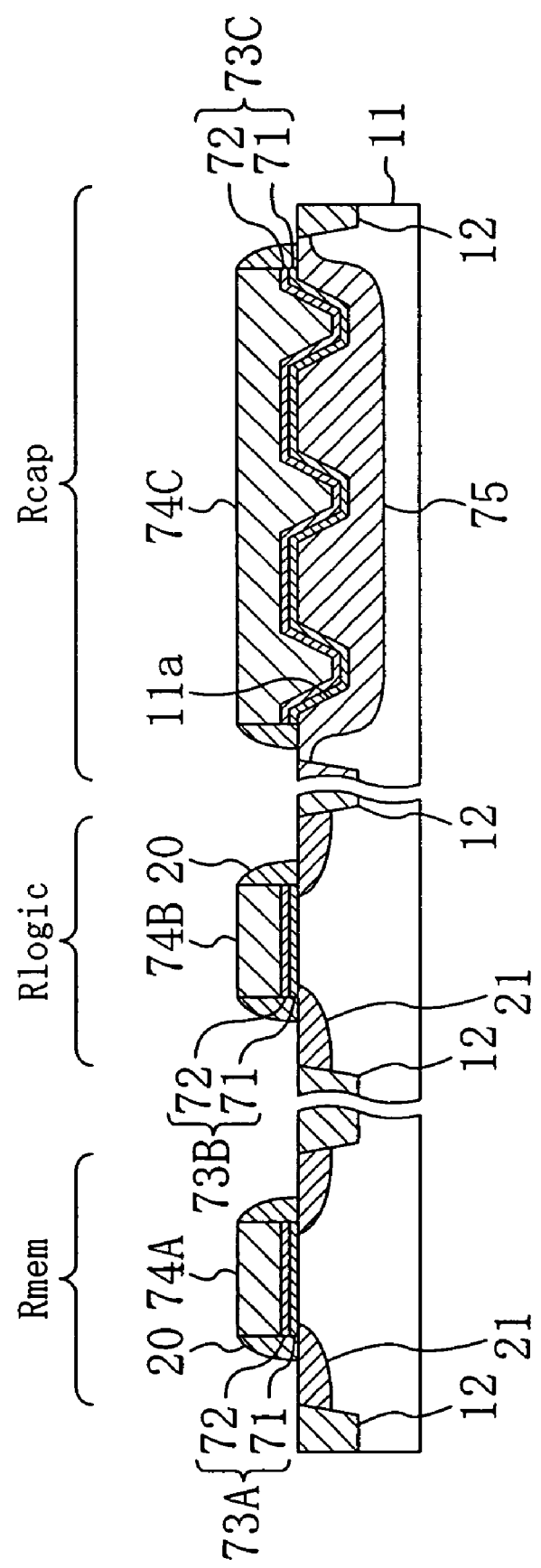
FIG. 11 is a cross-sectional view of a non-volatile semiconductor memory device according to a second embodiment of the present invention.

FIG. 11 shows a cross-sectional structure of a non-volatile semiconductor memory device according to the second embodiment of the present invention. In FIG. 11, the same members as those of the non-volatile semiconductor memory device of FIG. 1 are denoted with the same reference numerals and characters, and description thereof is omitted.

As shown in FIG. 11, in the non-volatile semiconductor memory device of the second embodiment, the storage element in the storage circuit region Rmem is formed as a so-called MNOS (Metal Nitride Oxide Semiconductor) type storage element for storing charges in a laminated film of an oxide film and a nitride film.

An element isolation insulating film 12 is selectively formed in the upper portion of a semiconductor substrate 11 in order to define a storage circuit region Rmem, a logic circuit region Rlogic and a capacitor region Rcap.

In the storage circuit region Rmem, a charge storage film 73A is formed on the semiconductor substrate 11. The charge storage film 73A is a lamination of a silicon oxide film 71 and a silicon oxynitride film 72. The silicon oxynitride film 72 is formed by nitriding the upper portion of the silicon oxide film 71. A first gate electrode 74A is formed on the charge storage film 73A. The first gate electrode 74A is formed from polysilicon.

A sidewall 20 is formed on both sides of the first gate electrode 74A. A source/drain region 21 is formed in the surface region of the semiconductor substrate 11 so as to extend from a position inside the sidewall 20 to a position outside the sidewall 20.

In the logic circuit region Rlogic, a second gate electrode 74B is formed on the semiconductor substrate 11 with a gate insulating film 73B interposed therebetween. The gate insulating film 73B is formed from the silicon oxide film 71 and the silicon oxynitride film 72. The second gate electrode 74B is formed from polysilicon. A sidewall 20 is formed on both sides of the second gate electrode 74B. A source/drain region 21 is formed in the surface region of the semiconductor substrate 11 so as to extend from a position inside the sidewall 20 to a position outside the sidewall 20.

In the capacitor region Rcap, a lower electrode 75 is formed in the semiconductor substrate 11. More specifically, in the capacitor region Rcap, concavities 11a having a depth of about 200 nm are formed in a square region of about 200 µm×about 200 µm in the upper portion of the semiconductor substrate 11. The lower electrode 75 is formed by implanting high concentration impurities into the bottom and side surfaces of the concavities 11a. An upper electrode 74C is formed on the lower electrode 75 with a capacitor capacitance insulating film 73C interposed therebetween. The capacitor capacitance insulating film 73C is formed from the silicon oxide film 71 and the silicon oxynitride film 72. The upper electrode 74C is formed from polysilicon.

The lower electrode 75 of the second embodiment has an increased surface area by shaping the upper portion of the semiconductor substrate 11.

More specifically, if circular concavities 11a are formed in the semiconductor substrate 11 in the capacitor region Rcap, the resultant lower electrode has the same shape as that of FIG. 3A. If grid-like concavities 11a are formed in the semiconductor substrate 11 in the capacitor region Rcap, the resultant lower electrode has the same shape as that of FIG. 3B. If stripe-shaped concavities 11a are formed in the semiconductor substrate 11 in the capacitor region Rcap, the resultant lower electrode has the same shape as that of FIG. 3C. This enables the capacitance of the capacitor to be increased without increasing the area of the capacitor. As a result, a capacitor which enables reduction in voltage of a non-volatile semiconductor memory device without impeding reduction in size of the non-volatile semiconductor memory device can be obtained.

In the non-volatile semiconductor memory device of the second embodiment, the charge storage film 73A in the storage circuit region Rmem, the gate insulating film 73B in the logic circuit region Rlogic and the capacitor capacitance insulating film 73C in the capacitor region Rcap are preferably formed from an insulating film which is formed in the same step. Moreover, the first gate electrode 74A in the storage circuit region Rmem, the second gate electrode 74B in the logic circuit region Rlogic and the upper electrode 74C in the capacitor region Rcap are preferably formed from a conductive film which is formed in the same step. This enables the step of forming the storage element and the step of forming the capacitor to be partially conducted in the same process. It should be appreciated that the charge storage film 73A, the gate insulating film 73B and the capacitor capacitance insulating film 73C may alternatively be formed from insulating films which are formed in separate steps, respectively, and the first gate electrode 74A, the second gate electrode 74B and the upper electrode 74C may alternatively be formed from conductive films which are formed in separate steps, respectively.

The non-volatile semiconductor memory device of the second embodiment uses the semiconductor substrate 11 for the lower electrode 75. This eliminates the need for a conductive film for forming the lower electrode, and enables a capacitor having a great capacitance to be obtained by increasing the depth of the concavities 11a.

Hereinafter, a method for manufacturing the above non-volatile semiconductor memory device of the second embodiment will be described with reference to the figures.

Figure 12A:
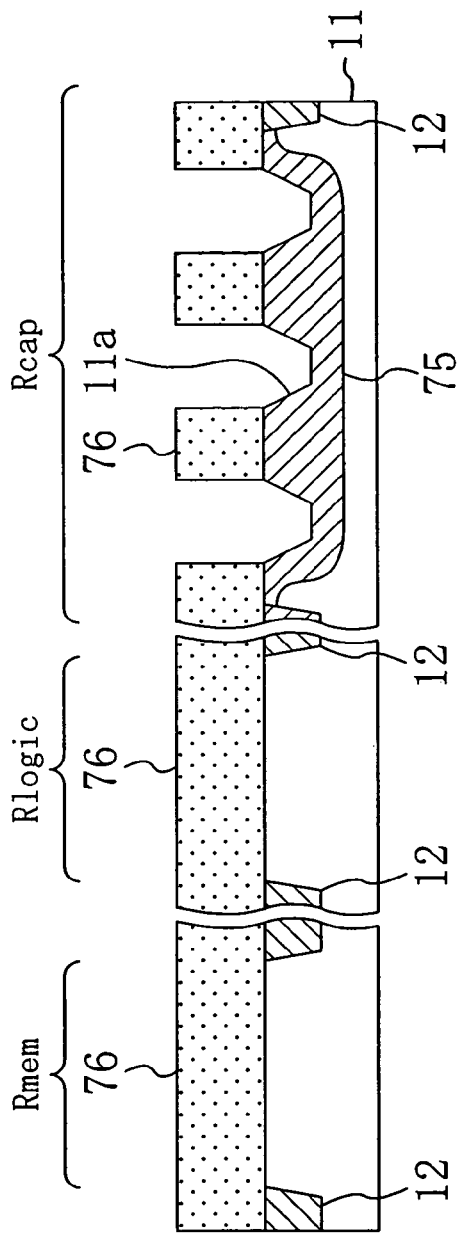
FIGS. 12A and 12B are cross-sectional views sequentially illustrating the steps of a method for manufacturing a non-volatile semiconductor memory device according to the second embodiment of the present invention.
Figure 12B:
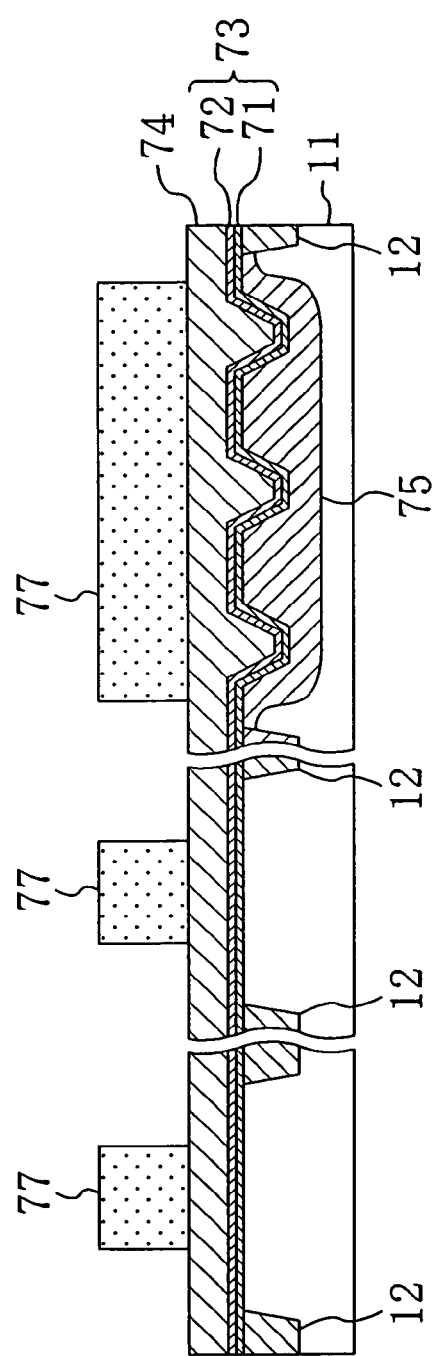

FIGS. 12A and 12B are cross-sectional views sequentially illustrating the steps of a method for manufacturing a non-volatile semiconductor memory device according to the second embodiment. In FIGS. 12A and 12B, the same members as those of FIG. 11 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

As shown in FIG. 12A, a resist pattern 76 is then formed by a photolithography method. The resist pattern 76 masks the storage circuit region Rmem and the logic circuit region Rlogic and has openings having a predetermined shape in the capacitor region Rcap. By using the resist pattern 76 as a mask, the semiconductor substrate 11 is etched by an anisotropic dry etching method in order to form concavities 11a in the semiconductor substrate 11.

By using the resist pattern 76 as a mask, high-concentration impurities are implanted into the bottom and side surfaces of the concavities 11a in order to form a lower electrode 75 in the semiconductor substrate 11 in the capacitor region Rcap.

If the resist pattern 76 has hole-shaped openings, grid-like openings or stripe-shaped openings in the capacitor region Rcap, the resultant lower electrode 75 has a plurality of concavities, a plurality of convexities or a plurality of stripe-shaped convexities corresponding to FIG. 3A, 3B or 3C, respectively.

As shown in FIG. 12B, the resist pattern 76 is then removed, and a silicon oxide film 71 is deposited on the whole surface of the semiconductor substrate 11 including the lower electrode 75 by, e.g., a reduced pressure CVD method. The upper portion of the silicon oxide film 71 is then nitrided to form a silicon oxynitride film 72. An ON film 73 is thus formed as a lamination of the silicon oxide film 71 and the silicon oxynitride film 72. A first conductive film 74 formed from polysilicon is then deposited on the ON film 73 by a reduced pressure CVD method. A resist pattern 77 is then formed on the first conductive film 74 by a photolithography method. The resist pattern 77 is used to pattern a storage element, a logic element and a capacitor in the storage circuit region Rmem, the logic circuit region Rlogic and the capacitor region Rcap, respectively.

The first conductive film 74, the silicon oxynitride film 72 and the silicon oxide film 71 are sequentially etched by using the resist pattern 77 as a mask. As a result, in the storage circuit region Rmem, the charge storage film 73A is formed from the silicon oxide film 71 and the silicon oxynitride film 72, and the first gate electrode 74A is formed from the first conductive film 74. At the same time, in the logic circuit region Rlogic, the gate insulating film 73B is formed from the silicon oxide film 71 and the silicon oxynitride film 72, and the second gate electrode 74B is formed from the first conductive film 74. Moreover, in the capacitor region Rcap, the capacitor capacitance insulating film 73C is formed from the silicon oxide film 71 and the silicon oxynitride film 72, and the upper electrode 74C is formed from the first conductive film 74.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the second embodiment in FIG. 11 is thus completed.

In the manufacturing method of the non-volatile semiconductor memory device of the second embodiment, the first gate electrode 74A of the storage element, the second gate electrode 74B of the logic element, and the upper electrode 74C of the capacitor are formed from a conductive film which is deposited in the same step. Moreover, the charge storage film 73A of the storage element, the gate insulating film 73B of the logic element, and the capacitor capacitance insulating film 73C are formed from an insulating film which is deposited in the same step. This enables a capacitor having a great capacitance to be formed without increasing the manufacturing costs.

(Third Embodiment)

Hereinafter, the third embodiment of the present invention will be described with reference to the figures.

Figure 13:
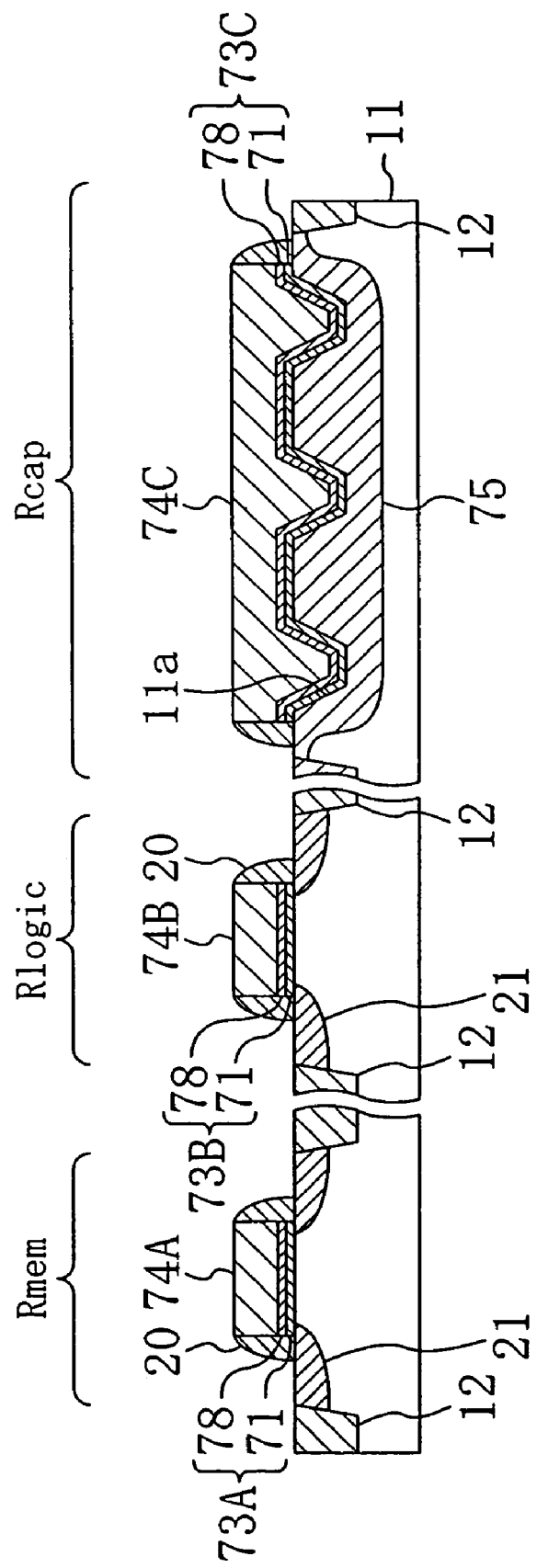
FIG. 13 is a cross-sectional view of a non-volatile semiconductor memory device according to a third embodiment of the present invention.

FIG. 13 shows a cross-sectional structure of a non-volatile semiconductor memory device according to the third embodiment of the present invention. In FIG. 13, the same members as those of the non-volatile semiconductor memory device of FIG. 11 are denoted with the same reference numerals and characters, and description thereof is omitted.

As shown in FIG. 13, in the non-volatile semiconductor memory device of the third embodiment, the storage element in the storage circuit region Rmem is formed as an MNOS-type storage element. The non-volatile semiconductor memory device of the third embodiment is different from that of the second embodiment in the structure of the insulating film for storing charges.

In the storage circuit region Rmem, a charge storage film 73A is formed on a semiconductor substrate 11. The charge storage film 73A is a lamination of a silicon oxide film 71 and a silicon nitride film 78. A first gate electrode 74A is formed on the charge storage film 73A. The first gate electrode 74A is formed from polysilicon.

A sidewall 20 is formed on both sides of the first gate electrode 74A. A source/drain region 21 is formed in the surface region of the semiconductor substrate 11 so as to extend from a position inside the sidewall 20 to a position outside the sidewall 20.

In the logic circuit region Rlogic, a second gate electrode 74B is formed on the semiconductor substrate 11 with a gate insulating film 73B interposed therebetween. The gate insulating film 73B is formed from the silicon oxide film 71 and the silicon nitride film 78. The second gate electrode 74B is formed from polysilicon. A sidewall 20 is formed on both sides of the second gate electrode 74B. A source/drain region 21 is formed in the surface region of the semiconductor substrate 11 so as to extend from a position inside the sidewall 20 to a position outside the sidewall 20.

In the capacitor region Rcap, a lower electrode 75 is formed in the semiconductor substrate 11. More specifically, in the capacitor region Rcap, concavities 11a having a depth of about 200 nm are formed in a square region of about 200 µm×about 200 µm in the upper portion of the semiconductor substrate 11. The lower electrode 75 is formed by implanting high concentration impurities into the bottom and side surfaces of the concavities 11a. An upper electrode 74C is formed on the lower electrode 75 with a capacitor capacitance insulating film 73C interposed therebetween. The capacitor capacitance insulating film 73C is formed from the silicon oxide film 71 and the silicon nitride film 78. The upper electrode 74C is formed from polysilicon.

Note that the lower electrode 75 of the third embodiment also has an increased surface area by implementing the shape of FIG. 3A, 3B or 3C.

In the non-volatile semiconductor memory device of the third embodiment, the charge storage film 73A in the storage circuit region Rmem, the gate insulating film 73B in the logic circuit region Rlogic and the capacitor capacitance insulating film 73C in the capacitor region Rcap are preferably formed from an insulating film which is formed in the same step. Moreover, the first gate electrode 74A in the storage circuit region Rmem, the second gate electrode 74B in the logic circuit region Rlogic and the upper electrode 74C in the capacitor region Rcap are preferably formed from a conductive film which is formed in the same step. This enables the step of forming the storage element and the step of forming the capacitor to be partially conducted in the same process. It should be appreciated that the charge storage film 73A, the gate insulating film 73B and the capacitor capacitance insulating film 73C may alternatively be formed from insulating films which are formed in separate steps, respectively, and the first gate electrode 74A, the second gate electrode 74B and the upper electrode 74C may alternatively be formed from conductive films which are formed in separate steps, respectively.

The non-volatile semiconductor memory device of the third embodiment uses the semiconductor substrate 11 for the lower electrode 75. This eliminates the need for a conductive film for forming the lower electrode, and enables a capacitor having a great capacitance to be obtained by increasing the depth of the concavities 11a.

Moreover, in the non-volatile semiconductor memory device of the third embodiment, the capacitor capacitance insulating film 73C is a lamination of the silicon oxide film 71 and the silicon nitride film 78. Therefore, the shape of the semiconductor substrate 11 is less likely to be varied as compared to the case where the silicon oxynitride film 72 is used. This enables improvement in reliability of the capacitor capacitance insulating film 73C.

Hereinafter, a method for manufacturing the above non-volatile semiconductor memory device of the third embodiment will be described with reference to the figures.

Figure 14A:
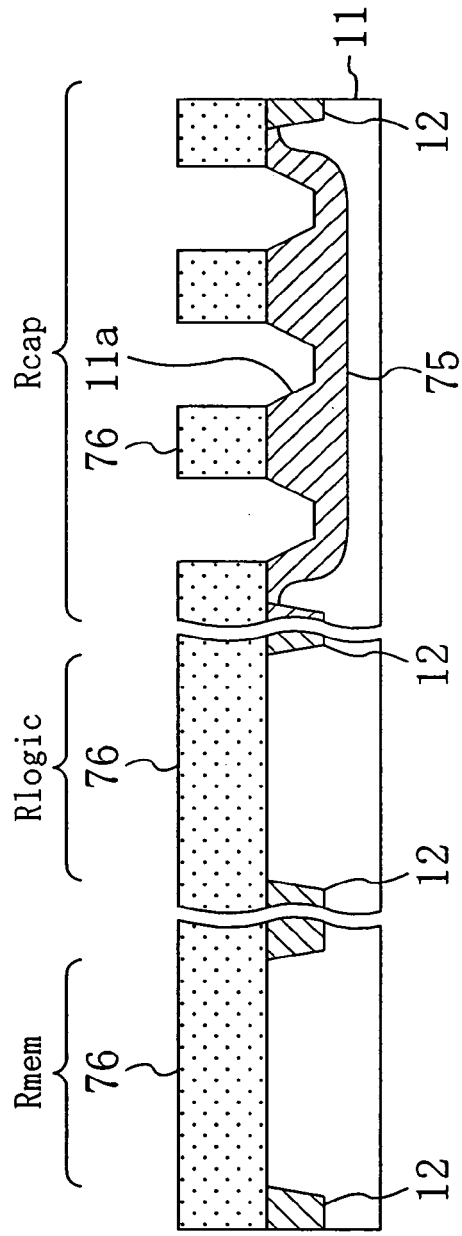
FIGS. 14A and 14B are cross-sectional views sequentially illustrating the steps of a method for manufacturing a non-volatile semiconductor memory device according to the third embodiment of the present invention.
Figure 14B:
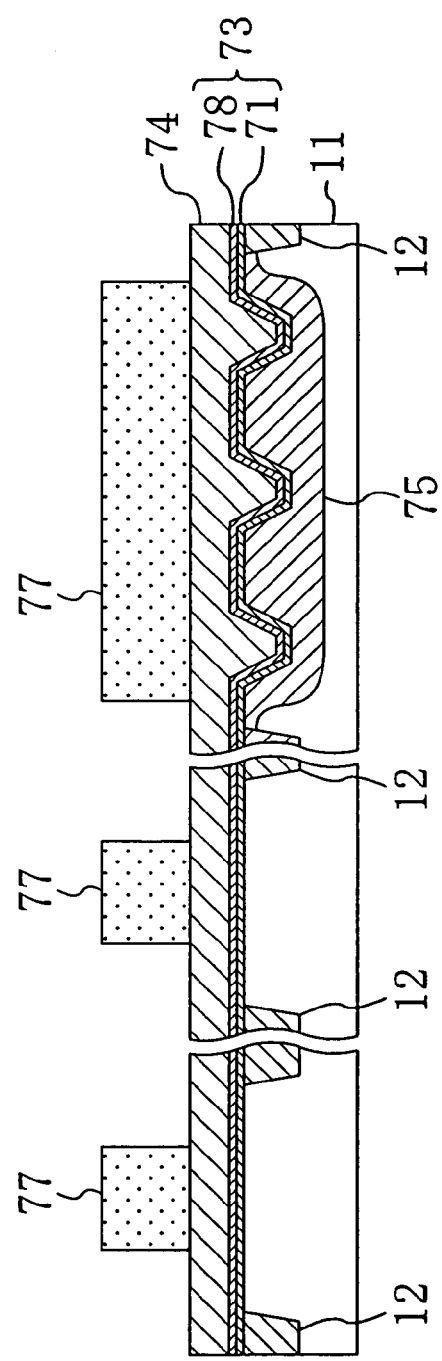

FIGS. 14A and 14B are cross-sectional views sequentially illustrating the steps of a method for manufacturing a non-volatile semiconductor memory device according to the third embodiment. In FIGS. 14A and 14B, the same members as those of FIG. 13 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

As shown in FIG. 14A, a resist pattern 76 is then formed by a photolithography method. The resist pattern 76 masks the storage circuit region Rmem and the logic circuit region Rlogic and has openings having a predetermined shape in the capacitor region Rcap. By using the resist pattern 76 as a mask, the semiconductor substrate 11 is etched by an anisotropic dry etching method in order to form concavities 11a in the semiconductor substrate 11.

By using the resist pattern 76 as a mask, high-concentration impurities are implanted into the bottom and side surfaces of the concavities 11a in order to form a lower electrode 75 in the semiconductor substrate 11 in the capacitor region Rcap.

If the resist pattern 76 has hole-shaped openings, grid-like openings or stripe-shaped openings in the capacitor region Rcap, the resultant lower electrode 75 has a plurality of concavities, a plurality of convexities or a plurality of stripe-shaped convexities corresponding to FIG. 3A, 3B or 3C, respectively.

As shown in FIG. 14B, the resist pattern 76 is then removed, and a silicon oxide film 71 is deposited on the whole surface of the semiconductor substrate 11 including the lower electrode 75 by, e.g., a reduced pressure CVD method. A silicon nitride film 78 and a first conductive film 74 are then sequentially deposited on the silicon oxide film 71 by, e.g., a reduced pressure CVD method. An ON film 73 is thus formed as a lamination of the silicon oxide film 71 and the silicon nitride film 78. A resist pattern 77 is then formed on the first conductive film 74 by a photolithography method. The resist pattern 77 is used to pattern a storage element, a logic element and a capacitor in the storage circuit region Rmem, the logic circuit region Rlogic and the capacitor region Rcap, respectively.

The first conductive film 74, the silicon nitride film 78 and the silicon oxide film 71 are sequentially etched by using the resist pattern 77 as a mask. As a result, in the storage circuit region Rmem, the charge storage film 73A is formed from the silicon oxide film 71 and the silicon nitride film 78, and the first gate electrode 74A is formed from the first conductive film 74. At the same time, in the logic circuit region Rlogic, the gate insulating film 73B is formed from the silicon oxide film 71 and the silicon nitride film 78, and the second gate electrode 74B is formed from the first conductive film 74. Moreover, in the capacitor region Rcap, the capacitor capacitance insulating film 73C is formed from the silicon oxide film 71 and the silicon nitride film 78, and the upper electrode 74C is formed from the first conductive film 74.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the third embodiment in FIG. 13 is thus completed.

(Fourth Embodiment)

Hereinafter, the fourth embodiment of the present invention will be described with reference to the figures.

Figure 15:
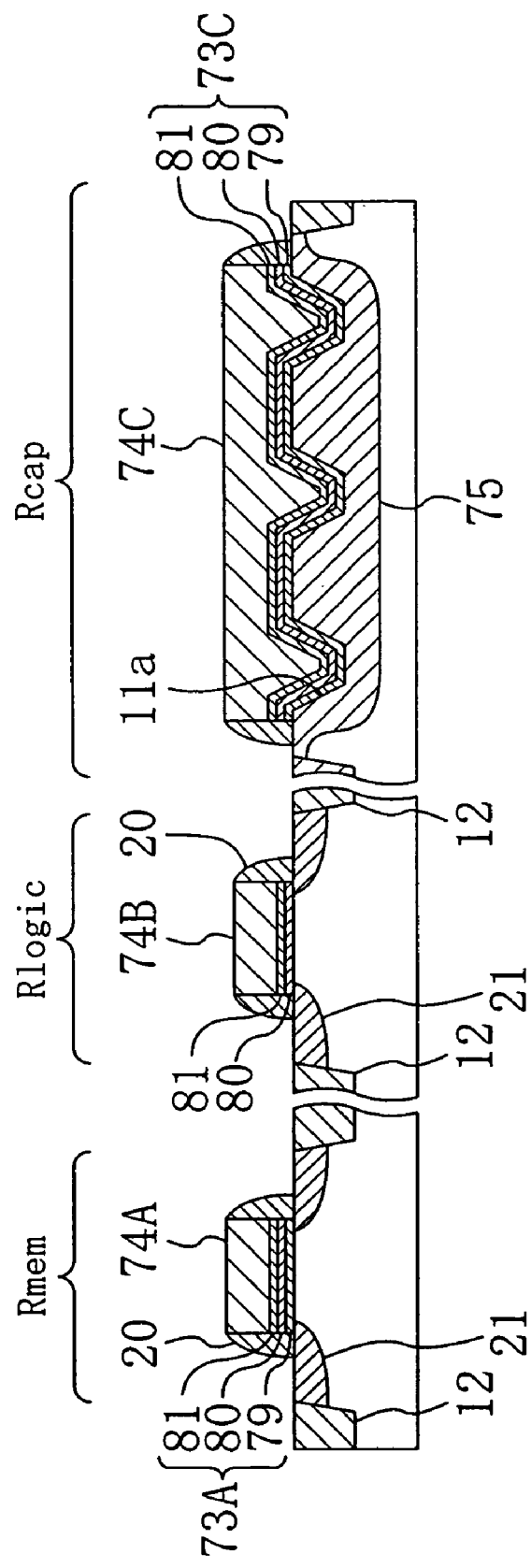
FIG. 15 is a cross-sectional view of a non-volatile semiconductor memory device according to a fourth embodiment of the present invention.

FIG. 15 shows a cross-sectional structure of a non-volatile semiconductor memory device according to the fourth embodiment of the present invention. In FIG. 15, the same members as those of the non-volatile semiconductor memory device of FIG. 11 are denoted with the same reference numerals and characters, and description thereof is omitted.

As shown in FIG. 15, in the non-volatile semiconductor memory device of the fourth embodiment, the storage element in the storage circuit region Rmem is formed as an MNOS-type storage element. The non-volatile semiconductor memory device of the fourth embodiment is different from that of the second embodiment in the structure of the insulating film for storing charges.

In the storage circuit region Rmem, a charge storage film 73A is formed on a semiconductor substrate 11. The charge storage film 73A is a lamination of a first silicon oxide film 79, a second silicon oxide film 80 and a silicon nitride film 81. A first gate electrode 74A is formed on the charge storage film 73A. The first gate electrode 74A is formed from polysilicon.

A sidewall 20 is formed on both sides of the first gate electrode 74A. A source/drain region 21 is formed in the surface region of the semiconductor substrate 11 so as to extend from a position inside the sidewall 20 to a position outside the sidewall 20.

In the logic circuit region Rlogic, a second gate electrode 74B is formed on the semiconductor substrate 11 with the second silicon oxide film 80 and the silicon nitride film 81 interposed therebetween. The second gate electrode 74B is formed from polysilicon. A sidewall 20 is formed on both sides of the second gate electrode 74B. The second silicon oxide film 80 and the silicon nitride film 81 in the logic circuit region Rlogic serve as a gate insulating film of a logic element. A source/drain region 21 is formed in the surface region of the semiconductor substrate 11 so as to extend from a position inside the sidewall 20 to a position outside the sidewall 20.

In the capacitor region Rcap, a lower electrode 75 is formed in the semiconductor substrate 11. More specifically, in the capacitor region Rcap, concavities 11a having a depth of about 200 nm are formed in a square region of about 200 μm×about 200 μm in the upper portion of the semiconductor substrate 11. The lower electrode 75 is formed by implanting high concentration impurities into the bottom and side surfaces of the concavities 11a. An upper electrode 74C is formed on the lower electrode 75 with a capacitor capacitance insulating film 73C interposed therebetween. The capacitor capacitance insulating film 73C is formed from the first silicon oxide film 79, the second silicon oxide film 80 and the silicon nitride film 81. The upper electrode 74C is formed from polysilicon.

Note that the lower electrode 75 of the fourth embodiment also has an increased surface area by implementing the shape of FIG. 3A, 3B or 3C.

In the non-volatile semiconductor memory device of the fourth embodiment, the charge storage film 73A in the storage circuit region Rmem and the capacitor capacitance insulating film 73C in the capacitor region Rcap are preferably formed from an insulating film which is formed in the same step. Moreover, the first gate electrode 74A in the storage circuit region Rmem, the second gate electrode 74B in the logic circuit region Rlogic and the upper electrode 74C in the capacitor region Rcap are preferably formed from a conductive film which is formed in the same step. This enables the step of forming the storage element and the step of forming the capacitor to be partially conducted in the same process. It should be appreciated that the charge storage film 73A and the capacitor capacitance insulating film 73C may alternatively be formed from insulating films which are formed in separate steps, respectively, and the first gate electrode 74A, the second gate electrode 74B and the upper electrode 74C may alternatively be formed from conductive films which are formed in separate steps, respectively.

The non-volatile semiconductor memory device of the fourth embodiment uses the semiconductor substrate 11 for the lower electrode 75. This eliminates the need for a conductive film for forming the lower electrode, and enables a capacitor having a great capacitance to be obtained by increasing the depth of the concavities 11a.

Moreover, in the non-volatile semiconductor memory device of the fourth embodiment, each of the charge storage film 73A and the capacitor capacitance insulating film 73C is a lamination of the first silicon oxide film 79, the second silicon oxide film 80 and the silicon nitride film 81. This enables improvement in reliability of the charge storage film 73A and the capacitor capacitance insulating film 73C. Moreover, the second silicon oxide film 80 and the silicon nitride film 81 are used as a gate insulating film of the logic element. This enables reduction in film thickness without reducing reliability, as compared to the case where a single-layer silicon oxide film is used as a gate insulating film of the logic element.

Hereinafter, a method for manufacturing the above non-volatile semiconductor memory device of the fourth embodiment will be described with reference to the figures.

FIGS. 16A and 16B are cross-sectional views sequentially illustrating the steps of a method for manufacturing a non-volatile semiconductor memory device according to the fourth embodiment. In FIGS. 16A and 16B, the same members as those of FIG. 15 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

Like the step of FIG. 14A, concavities 11a are formed in the semiconductor substrate 11. High-concentration impurities are then implanted into the bottom and side surfaces of the concavities 11a in order to form a lower electrode 75 in the semiconductor substrate 11 in the capacitor region Rcap.

As shown in FIG. 16A, a first silicon oxide film 79 is deposited on the whole surface of the semiconductor substrate 11 including the lower electrode 75 by, e.g., a reduced pressure CVD method. A resist pattern 82 is then formed by a photolithography method. The resist pattern 82 masks the storage circuit region Rmem and the capacitor region Rcap and exposes the logic circuit region Rlogic. By using the resist pattern 82 as a mask, the exposed portion of the first silicon oxide film 79, i.e., the first silicon oxide film 79 in the logic circuit region Rlogic, is etched away by a wet etching method.

As shown in FIG. 16B, the resist pattern 82 is then removed. Thereafter, a second silicon oxide film 80, a silicon nitride film 81 and a first conductive film 74 are sequentially deposited on the exposed surface of semiconductor substrate 11 in the logic circuit region Rlogic and the whole surface of the first silicon oxide film 79 by a reduced pressure CVD method. An ON film 73 is thus formed in the storage circuit region Rmem and the capacitor region Rcap as a lamination of the first silicon oxide film 79, the second silicon oxide film 80 and the silicon nitride film 81. A resist pattern 77 is then formed on the first conductive film 74 by a photolithography method. The resist pattern 77 is used to pattern a storage element, a logic element and a capacitor in the storage circuit region Rmem, the logic circuit region Rlogic and the capacitor region Rcap, respectively.

The first conductive film 74, the silicon nitride film 81, the second silicon oxide film 80 and the first silicon oxide film 79 are sequentially etched by using the resist pattern 77 as a mask. As a result, in the storage circuit region Rmem, the charge storage film 73A is formed from the first silicon oxide film 79, the second silicon oxide film 80 and the silicon nitride film 81, and the first gate electrode 74A is formed from the first conductive film 74. At the same time, in the logic circuit region Rlogic, the gate insulating film is formed from the second silicon oxide film 80 and the silicon nitride film 81, and the second gate electrode 74B is formed from the first conductive film 74. Moreover, in the capacitor region Rcap, the capacitor capacitance insulating film 73C is formed from the first silicon oxide film 79, the second silicon oxide film 80 and the silicon nitride film 81, and the upper electrode 74C is formed from the first conductive film 74.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the fourth embodiment in FIG. 15 is thus completed.

(Fifth Embodiment)

Hereinafter, the fifth embodiment of the present invention will be described with reference to the figures.

Figure 17:
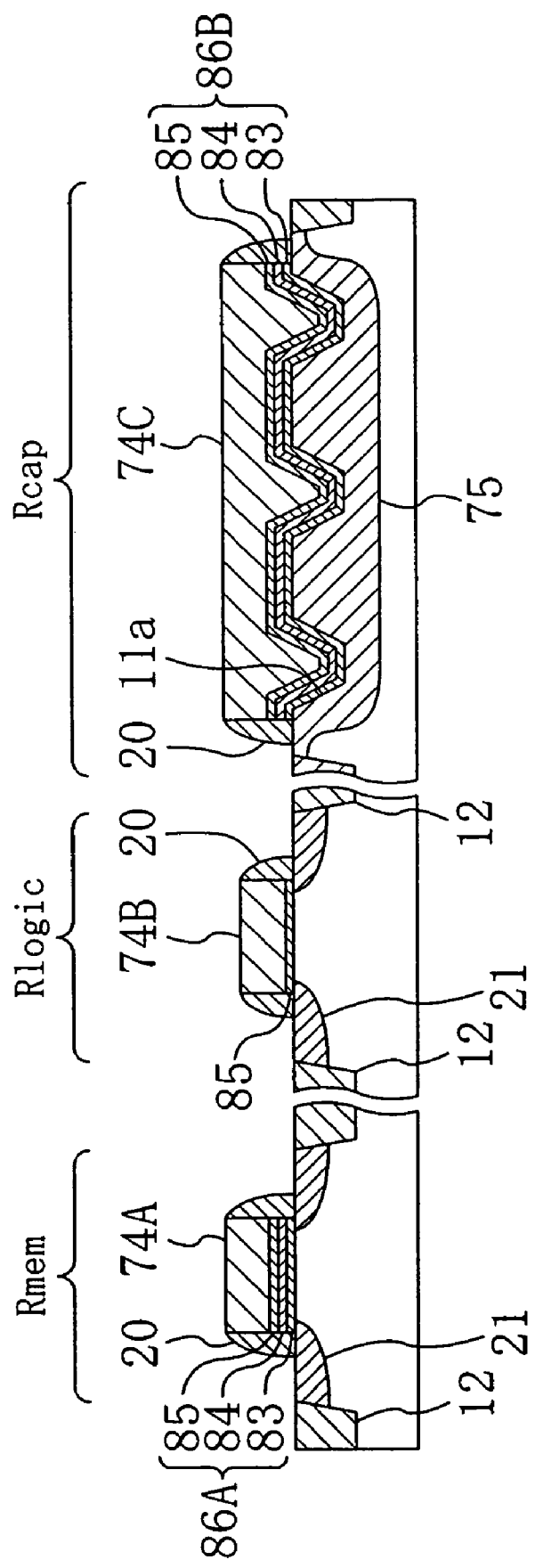
FIG. 17 is a cross-sectional view of a non-volatile semiconductor memory device according to a fifth embodiment of the present invention.

FIG. 17 shows a cross-sectional structure of a non-volatile semiconductor memory device according to the fifth embodiment of the present invention. In FIG. 17, the same members as those of the non-volatile semiconductor memory device of FIG. 15 are denoted with the same reference numerals and characters, and description thereof is omitted.

As shown in FIG. 17, in the non-volatile semiconductor memory device of the fifth embodiment, the storage element in the storage circuit region Rmem is formed as a so-called MONOS (Metal Oxide Nitride Oxide Semiconductor) type storage element for storing charges in a laminated film of an oxide film, a nitride film and an oxide film.

In the storage circuit region Rmem, a charge storage film 86A is formed on a semiconductor substrate 11. The charge storage film 86A is a lamination of a first silicon oxide film 83, a silicon nitride film 84 and a second silicon oxide film 85. A first gate electrode 74A is formed on the charge storage film 86A. The first gate electrode 74A is formed from polysilicon.

A sidewall 20 is formed on both sides of the first gate electrode 74A. A source/drain region 21 is formed in the surface region of the semiconductor substrate 11 so as to extend from a position inside the sidewall 20 to a position outside the sidewall 20.

In the logic circuit region Rlogic, a second gate electrode 74B is formed on the semiconductor substrate 11 with the second silicon oxide film 85 interposed therebetween. The second gate electrode 74B is formed from polysilicon. A sidewall 20 is formed on both sides of the second gate electrode 74B. The second silicon oxide film 85 in the logic circuit region Rlogic serves as a gate insulating film of a logic element. A source/drain region 21 is formed in the surface region of the semiconductor substrate 11 so as to extend from a position inside the sidewall 20 to a position outside the sidewall 20.

In the capacitor region Rcap, a lower electrode 75 is formed in the semiconductor substrate 11. More specifically, in the capacitor region Rcap, concavities 11a having a depth of about 200 nm are formed in a square region of about 200 μm×about 200 μm in the upper portion of the semiconductor substrate 11. The lower electrode 75 is formed by implanting high concentration impurities into the bottom and side surfaces of the concavities 11a. An upper electrode 74C is formed on the lower electrode 75 with a capacitor capacitance insulating film 86B interposed therebetween. The capacitor capacitance insulating film 86B is formed from the first silicon oxide film 83, the silicon nitride film 84 and the second silicon oxide film 85. The upper electrode 74C is formed from polysilicon.

Note that the lower electrode 75 of the fifth embodiment also has an increased surface area by implementing the shape of FIG. 3A, 3B or 3C.

In the non-volatile semiconductor memory device of the fifth embodiment, the charge storage film 86A in the storage circuit region Rmem and the capacitor capacitance insulating film 86B in the capacitor region Rcap are preferably formed from an insulating film which is formed in the same step. Moreover, the first gate electrode 74A in the storage circuit region Rmem, the second gate electrode 74B in the logic circuit region Rlogic and the upper electrode 74C in the capacitor region Rcap are preferably formed from a conductive film which is formed in the same step. This enables the step of forming the storage element and the step of forming the capacitor to be partially conducted in the same process.

The non-volatile semiconductor memory device of the fifth embodiment uses the semiconductor substrate 11 for the lower electrode 75. This eliminates the need for a conductive film for forming the lower electrode, and enables a capacitor having a great capacitance to be obtained by increasing the depth of the concavities 11a.

Moreover, in the non-volatile semiconductor memory device of the fifth embodiment, each of the charge storage film 86A and the capacitor capacitance insulating film 86B is a lamination (ONO film) of the first silicon oxide film 83, the silicon nitride film 84 and the second silicon oxide film 85. This enables improvement in reliability of the charge storage film 86A and the capacitor capacitance insulating film 86B over the structure using an ON film.

Hereinafter, a method for manufacturing the above non-volatile semiconductor memory device of the fifth embodiment will be described with reference to the figures.

FIGS. 18A and 18B are cross-sectional views sequentially illustrating the steps of a method for manufacturing a non-volatile semiconductor memory device according to the fifth embodiment. In FIGS. 18A and 18B, the same members as those of FIG. 17 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

Like the step of FIG. 14A, concavities 11a are formed in the semiconductor substrate 11. High-concentration impurities are then implanted into the bottom and side surfaces of the concavities 11a in order to form a lower electrode 75 in the semiconductor substrate 11 in the capacitor region Rcap.

As shown in FIG. 18A, a first silicon oxide film 83 and a silicon nitride film 84 are sequentially deposited on the whole surface of the semiconductor substrate 11 including the lower electrode 75 by, e.g., a reduced pressure CVD method. A resist pattern 82 is then formed by a photolithography method. The resist pattern 82 masks the storage circuit region Rmem and the capacitor region Rcap and exposes the logic circuit region Rlogic. By using the resist pattern 82 as a mask, the silicon nitride film 84 and the first silicon oxide film 83 in the logic circuit region Rlogic are sequentially etched away.

As shown in FIG. 18B, the resist pattern 82 is then removed. Thereafter, a second silicon oxide film 85 and a first conductive film 74 are sequentially deposited on the exposed surface of the semiconductor substrate 11 in the logic circuit region Rlogic and the whole surface of the silicon nitride film 84 by a reduced pressure CVD method. An ONO film 86 is thus formed in the storage circuit region Rmem and the capacitor region Rcap as a lamination of the first silicon oxide film 83, the silicon nitride film 84 and the second silicon oxide film 85. A resist pattern 77 is then formed on the first conductive film 74 by a photolithography method. The resist pattern 77 is used to pattern a storage element, a logic element and a capacitor in the storage circuit region Rmem, the logic circuit region Rlogic and the capacitor region Rcap, respectively.

The first conductive film 74, the second silicon oxide film 85, the silicon nitride film 84, and the first silicon oxide film 83 are sequentially etched by using the resist pattern 77 as a mask. As a result, in the storage circuit region Rmem, the charge storage film 86A is formed from the ONO film 86, and the first gate electrode 74A is formed from the first conductive film 74. At the same time, in the logic circuit region Rlogic, the gate insulating film is formed from the second silicon oxide film 85, and the second gate electrode 74B is formed from the first conductive film 74. Moreover, in the capacitor region Rcap, the capacitor capacitance insulating film 86B is formed from the ONO film 86, and the upper electrode 74C is formed from the first conductive film 74.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the fifth embodiment in FIG. 17 is thus completed.

(Sixth Embodiment)

Hereinafter, the sixth embodiment of the present invention will be described with reference to the figures.

Figure 19:
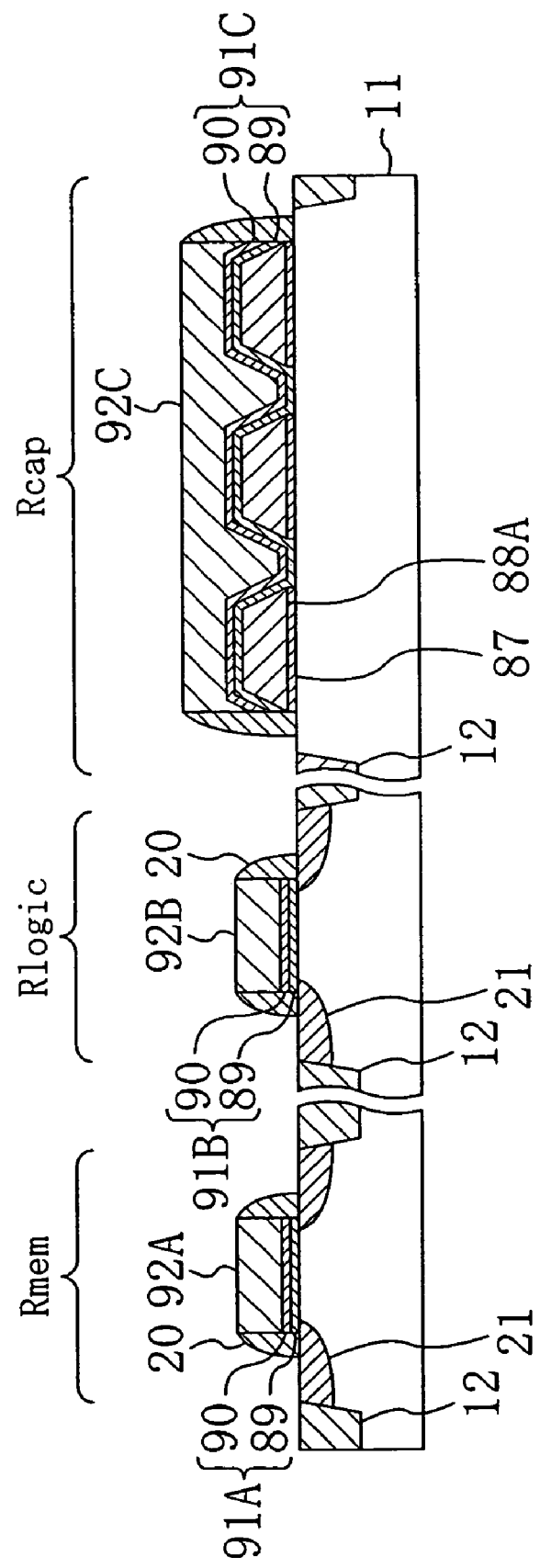
FIG. 19 is a cross-sectional view of a non-volatile semiconductor memory device according to a sixth embodiment of the present invention.

FIG. 19 shows a cross-sectional structure of a non-volatile semiconductor memory device according to the sixth embodiment of the present invention. In FIG. 19, the same members as those of the non-volatile semiconductor memory device of FIG. 11 are denoted with the same reference numerals and characters, and description thereof is omitted.

As shown in FIG. 19, in the non-volatile semiconductor memory device of the sixth embodiment, the storage element in the storage circuit region Rmem is formed as an MNOS-type storage element. The non-volatile semiconductor memory device of the sixth embodiment is different from that of the second embodiment in the structure of the capacitor.

In the capacitor region Rcap, a lower electrode 88A is formed on a semiconductor substrate 11 with a first silicon oxide film 87 interposed therebetween. More specifically, the lower electrode 88A is formed in a square region of about 200 µm×about 200 µm, and is formed from polysilicon. Like the lower electrodes of FIGS. 2A to 2C and FIGS. 3A to 3C, the lower electrode 88A is formed by shaping a plate-like conductive film so as to increase the surface area. An upper electrode 92C is formed on the lower electrode 88A with a capacitor capacitance insulating film 91C interposed therebetween. The upper electrode 92C is formed from polysilicon. The capacitor capacitance insulating film 91C is formed from a second silicon oxide film 89 and a silicon oxynitride film 90. The silicon oxynitride film 90 is formed by nitriding the upper portion of the second silicon oxide film 89.

In the storage circuit region Rmem, a charge storage film 91A is formed on the semiconductor substrate 11. The charge storage film 91A is a lamination of the second silicon oxide film 89 and the silicon oxynitride film 90. A first gate electrode 92A is formed on the charge storage film 91A. The first gate electrode 92A is formed from polysilicon.

A sidewall 20 is formed on both sides of the first gate electrode 92A. A source/drain region 21 is formed in the surface region of the semiconductor substrate 11 so as to extend from a position inside the sidewall 20 to a position outside the sidewall 20.

In the logic circuit region Rlogic, a second gate electrode 92B is formed on the semiconductor substrate 11 with a gate insulating film 91B interposed therebetween. The gate insulating film 91B is formed from the second silicon oxide film 89 and the silicon oxynitride film 90. The second gate electrode 92B is formed from polysilicon. A sidewall 20 is formed on both sides of the second gate electrode 92B. A source/drain region 21 is formed in the surface region of the semiconductor substrate 11 so as to extend from a position inside the sidewall 20 to a position outside the sidewall 20.

In the non-volatile semiconductor memory device of the sixth embodiment, the charge storage film 91A in the storage circuit region Rmem, the gate insulating film 91B in the logic circuit region Rlogic and the capacitor capacitance insulating film 91C in the capacitor region Rcap are preferably formed from an insulating film which is formed in the same step. Moreover, the first gate electrode 92A in the storage circuit region Rmem, the second gate electrode 92B in the logic circuit region Rlogic and the upper electrode 92C in the capacitor region Rcap are preferably formed from a conductive film which is formed in the same step. This enables the step of forming the storage element and the step of forming the capacitor to be partially conducted in the same process. It should be appreciated that the charge storage film 91A, the gate insulating film 91B and the capacitor capacitance insulating film 91C may alternatively be formed from insulating films which are formed in separate steps, respectively, and the first gate electrode 92A, the second gate electrode 92B and the upper electrode 92C may alternatively be formed from conductive films which are formed in separate steps, respectively.

In the non-volatile semiconductor memory device of the sixth embodiment, the lower electrode 88A is formed from a conductive film. Therefore, the lower electrode is less likely to be subjected to depletion as compared to the case where the semiconductor substrate 11 is used for the lower electrode. As a result, stable capacitor characteristics can be obtained.

Hereinafter, a method for manufacturing the above non-volatile semiconductor memory device of the sixth embodiment will be described with reference to the figures.

Figure 21:
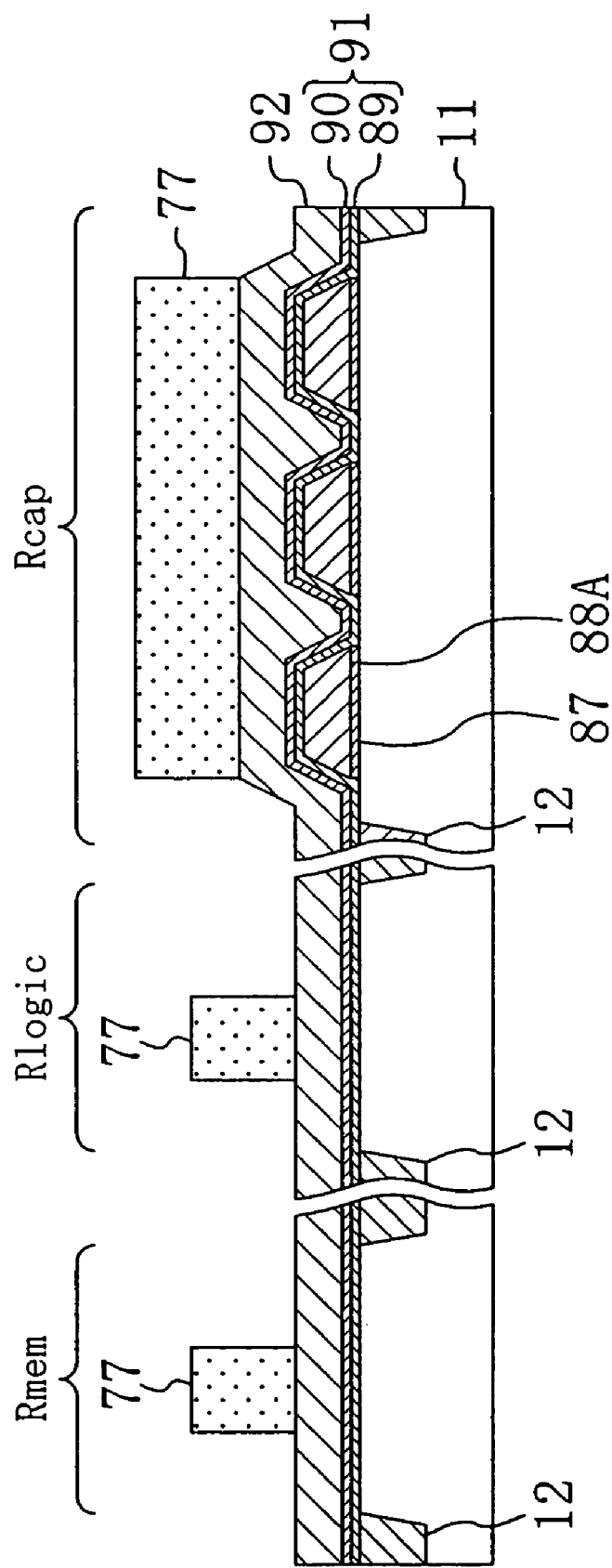
FIG. 21 is a cross-sectional view sequentially illustrating the steps of the method for manufacturing a non-volatile semiconductor memory device according to the sixth embodiment of the present invention.

FIGS. 20A, 20B and 21 are cross-sectional views sequentially illustrating the steps of a method for manufacturing a non-volatile semiconductor memory device according to the sixth embodiment. In FIGS. 20A, 20B and 21, the same members as those of FIG. 19 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

As shown in FIG. 20A, a first silicon oxide film 87 and a first conductive film 88 are sequentially deposited on the whole surface of the semiconductor substrate 11 by a reduced pressure CVD method. The first conductive film 88 is formed from polysilicon. A resist pattern 93 is then formed on the first conductive film 88 by a photolithography method. The resist pattern 93 exposes the storage circuit region Rmem and the logic circuit region Rlogic and has openings having a predetermined shape in the capacitor region Rcap.

As shown in FIG. 20B, an anisotropic dry etching method is conducted using the resist pattern 93 as a mask, whereby the first conductive film 88 in the storage circuit region Rmem and the logic circuit region Rlogic is removed, and the first conductive film 88 in the capacitor region Rcap is patterned into a predetermined shape to form a lower electrode 88A. Thereafter, the first silicon oxide film 87 in the storage circuit region Rmem and the logic circuit region Rlogic and the exposed portion of the first silicon oxide film 87 in the capacitor region Rcap are removed by a wet etching method.

If the resist pattern 93 has hole-shaped openings, grid-like openings or stripe-shaped openings in the capacitor region Rcap, a plurality of holes, a plurality of lower electrode portions, or a plurality of stripe-shaped lower electrodes portions corresponding to FIG. 2A, 2B or 2C can be formed in the lower electrode 88A. By adjusting the etching time, a plurality of concavities, a plurality of convexities or a plurality of stripe-shaped convexities corresponding to FIG. 3A, 3B or 3B can be formed in the lower electrode 88A.

The resist pattern 93 is then removed, and a second silicon oxide film 89 is deposited on the whole surface of the semiconductor substrate 11 including the lower electrode 88A by a reduced pressure CVD method. The upper portion of the second silicon oxide film 89 is then nitrided to form a silicon oxynitride film 90. An ON film 91 is thus formed as a lamination of the second silicon oxide film 89 and the silicon oxynitride film 90.

As shown in FIG. 21, a second conductive film 92 is deposited on the silicon oxynitride film 90 by a reduced pressure CVD method. A resist pattern 77 is then formed on the second conductive film 92 by a photolithography method. The resist pattern 77 is used to pattern a storage element, a logic element and a capacitor in the storage circuit region Rmem, the logic circuit region Rlogic and the capacitor region Rcap, respectively.

The second conductive film 92, the silicon oxynitride film 90 and the second silicon oxide film 89 are sequentially etched by using the resist pattern 77 as a mask. As a result, in the storage circuit region Rmem, the charge storage film 91A is formed from the second silicon oxide film 89 and the silicon oxynitride film 90, and the first gate electrode 92A is formed from the second conductive film 92. At the same time, in the logic circuit region Rlogic, the gate insulating film 91B is formed from the second silicon oxide film 89 and the silicon oxynitride film 90, and the second gate electrode 92B is formed from the second conductive film 92. Moreover; in the capacitor region Rcap, the capacitor capacitance insulating film 91C is formed from the second silicon oxide film 89 and the silicon oxynitride film 90, and the upper electrode 92C is formed from the second conductive film 92.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the sixth embodiment in FIG. 19 is thus completed.

In the manufacturing method of the non-volatile semiconductor memory device according to the sixth embodiment, the first gate electrode 92A of the storage element, the second gate electrode 92B of the logic element and the upper electrode 92C of the capacitor are formed from a conductive film which is deposited in the same step. Moreover, the charge storage film 91A of the storage element, the gate insulating film 91B of the logic element and the capacitor capacitance insulating film 91C are formed from an insulating film which is deposited in the same step. This enables a capacitor having a great capacitance to be formed without increasing the manufacturing costs.

(Seventh Embodiment)

Hereinafter, the seventh embodiment of the present invention will be described with reference to the figures.

Figure 22:
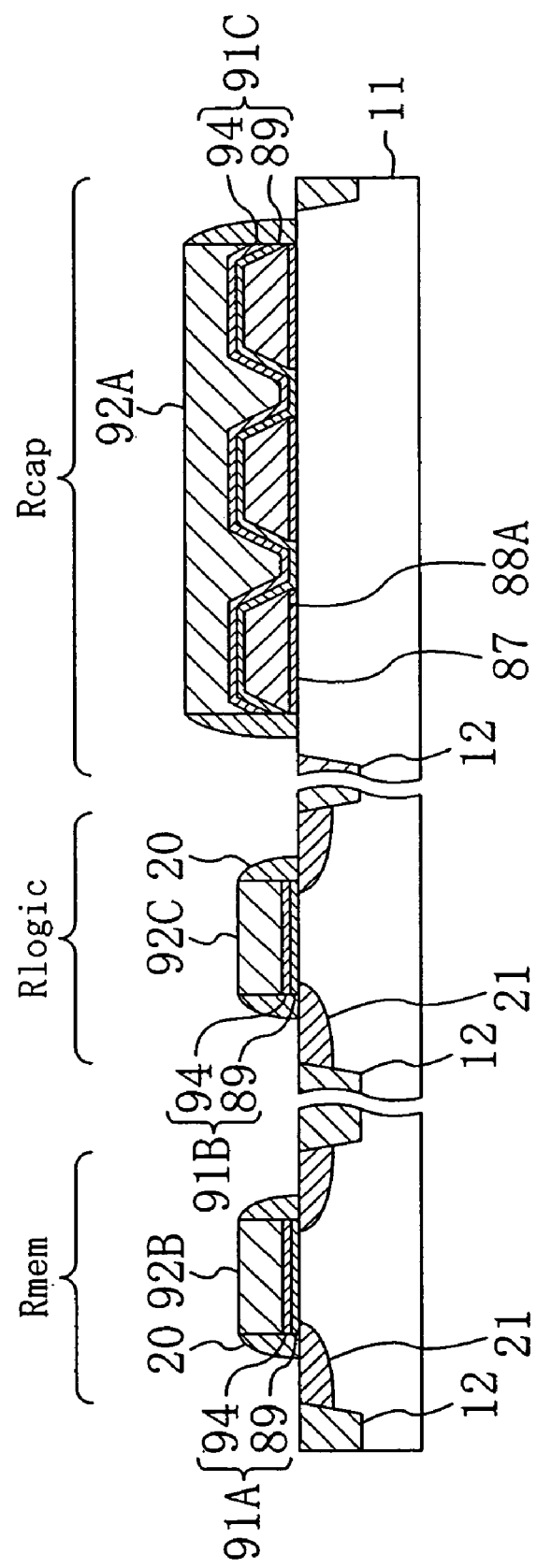
FIG. 22 is a cross-sectional view of a non-volatile semiconductor memory device according to a seventh embodiment of the present invention.

FIG. 22 shows a cross-sectional structure of a non-volatile semiconductor memory device according to the seventh embodiment of the present invention. In FIG. 22, the same members as those of the non-volatile semiconductor memory device of FIG. 19 are denoted with the same reference numerals and characters, and description thereof is omitted.

As shown in FIG. 22, in the non-volatile semiconductor memory device of the seventh embodiment, the storage element in the storage circuit region Rmem is formed as an MNOS-type storage element. The non-volatile semiconductor memory device of the seventh embodiment is different from that of the third embodiment in the structure of the capacitor.

In the capacitor region Rcap, a lower electrode 88A is formed on a semiconductor substrate 11 with a first silicon oxide film 87 interposed therebetween. More specifically, the lower electrode 88A is formed in a square region of about 200 µm×about 200 µm, and is formed from polysilicon. Like the lower electrodes of FIGS. 2A to 2C and FIGS. 3A to 3C, the lower electrode 88A is formed by shaping a plate-like conductive film so as to increase the surface area. An upper electrode 92C is formed on the lower electrode 88A with a capacitor capacitance insulating film 91C interposed therebetween. The upper electrode 92C is formed from polysilicon. The capacitor capacitance insulating film 91C is formed from a second silicon oxide film 89 and a silicon nitride film 94.

In the storage circuit region Rmem, a charge storage film 91A is formed on the semiconductor substrate 11. The charge storage film 91A is a lamination of the second silicon oxide film 89 and the silicon nitride film 94. A first gate electrode 92A is formed on the charge storage film 91A. The first gate electrode 92A is formed from polysilicon.

A sidewall 20 is formed on both sides of the first gate electrode 92A. A source/drain region 21 is formed in the surface region of the semiconductor substrate 11 so as to extend from a position inside the sidewall 20 to a position outside the sidewall 20.

In the logic circuit region Rlogic, a second gate electrode 92B is formed on the semiconductor substrate 11 with a gate insulating film 91B interposed therebetween. The gate insulating film 91B is formed from the second silicon oxide film 89 and the silicon nitride film 94. The second gate electrode 92B is formed from polysilicon. A sidewall 20 is formed on both sides of the second gate electrode 92B. A source/drain region 21 is formed in the surface region of the semiconductor substrate 11 so as to extend from a position inside the sidewall 20 to a position outside the sidewall 20.

In the non-volatile semiconductor memory device of the seventh embodiment, the charge storage film 91A in the storage circuit region Rmem, the gate insulating film 91B in the logic circuit region Rlogic and the capacitor capacitance insulating film 91C in the capacitor region Rcap are preferably formed from an insulating film which is formed in the same step. Moreover, the first gate electrode 92A in the storage circuit region Rmem, the second gate electrode 92B in the logic circuit region Rlogic and the upper electrode 92C in the capacitor region Rcap are preferably formed from a conductive film which is formed in the same step. This enables the step of forming the storage element and the step of forming the capacitor to be partially conducted in the same process. It should be appreciated that the charge storage film 91A, the gate insulating film 91B and the capacitor capacitance insulating film 91C may alternatively be formed from insulating films which are formed in separate steps, respectively, and the first gate electrode 92A, the second gate electrode 92B and the upper electrode 92C may alternatively be formed from conductive films which are formed in separate steps, respectively.

In the non-volatile semiconductor memory device of the seventh embodiment, the lower electrode 88A is formed from a conductive film. Therefore, the lower electrode is less likely to be subjected to depletion as compared to the case where the semiconductor substrate 11 is used for the lower electrode. As a result, stable capacitor characteristics can be obtained.

Moreover, in the non-volatile semiconductor memory device of the seventh embodiment, the capacitor capacitance insulating film 91C is a lamination of the second silicon oxide film 89 and the silicon nitride film 94. Therefore, the shape of the lower electrode 88A is less likely to be varied as compared to the case where the silicon oxynitride film 90 is used. This enables improvement in reliability of the capacitor capacitance insulating film 91C.

Hereinafter, a method for manufacturing the above non-volatile semiconductor memory device of the seventh embodiment will be described with reference to the figures.

Figure 23A:
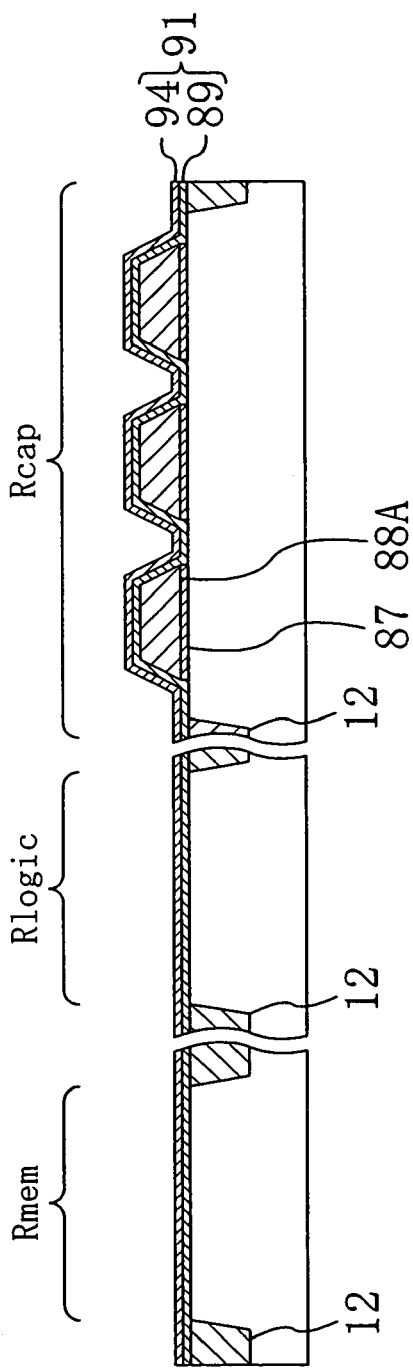
FIGS. 23A and 23B are cross-sectional views sequentially illustrating the steps of a method for manufacturing a non-volatile semiconductor memory device according to the seventh embodiment of the present invention.
Figure 23B:
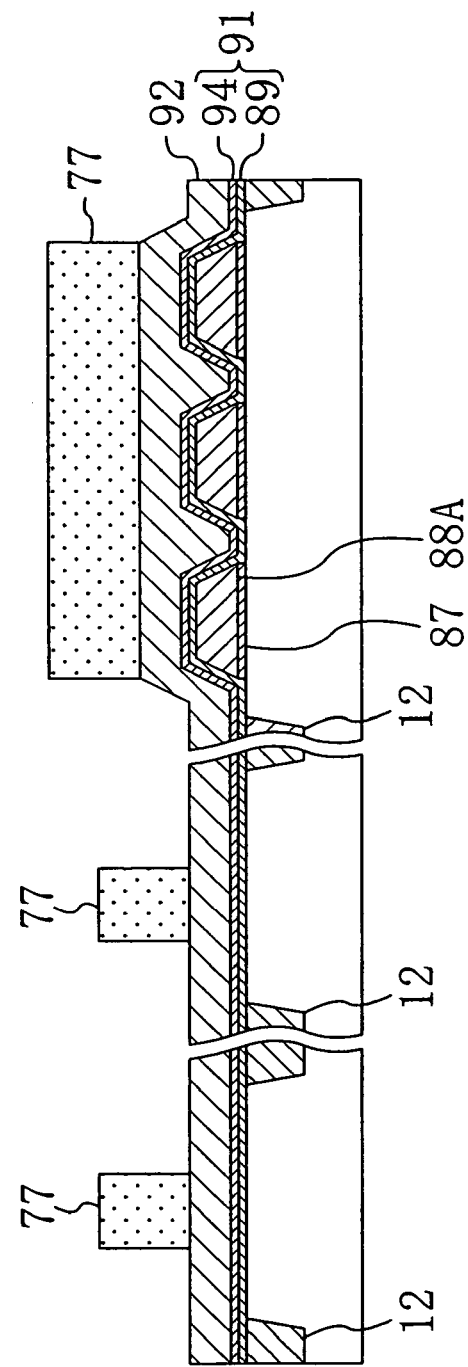

FIGS. 23A and 23B are cross-sectional views sequentially illustrating the steps of a method for manufacturing a non-volatile semiconductor memory device according to the seventh embodiment. In FIGS. 23A and 23B, the same members as those of FIG. 22 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

Like the step of FIG. 20A, a first silicon oxide film 87 and a first conductive film 88 are deposited on the whole surface of the semiconductor substrate 11.

As shown in FIG. 23A, the first conductive film 88 is patterned into a lower electrode 88A, and a second silicon oxide film 89 and a silicon nitride film 94 are then sequentially deposited on the whole surface of the semiconductor substrate 11 including the lower electrode 88A by a reduced pressure CVD method. As a result, an ON film 91 is formed as a lamination of the second silicon oxide film 89 and the silicon nitride film 94.

As shown in FIG. 23B, a second conductive film 92 is deposited on the silicon nitride film 94 by a reduced pressure CVD method. A resist pattern 77 is then formed on the second conductive film 92 by a photolithography method. The resist pattern 77 is used to pattern a storage element, a logic element and a capacitor in the storage circuit region Rmem, the logic circuit region Rlogic and the capacitor region Rcap, respectively.

The second conductive film 92, the silicon nitride film 94 and the second silicon oxide film 89 are sequentially etched by using the resist pattern 77 as a mask. As a result, in the storage circuit region Rmem, the charge storage film 91A is formed from the second silicon oxide film 89 and the silicon nitride film 94, and the first gate electrode 92A is formed from the second conductive film 92. At the same time, in the logic circuit region Rlogic, the gate insulating film 91B is formed from the second silicon oxide film 89 and the silicon nitride film 94, and the second gate electrode 92B is formed from the second conductive film 92. Moreover, in the capacitor region Rcap, the capacitor capacitance insulating film 91C is formed from the second silicon oxide film 89 and the silicon nitride film 94, and the upper electrode 92C is formed from the second conductive film 92.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the seventh embodiment in FIG. 22 is thus completed.

(Eighth Embodiment)

Hereinafter, the eighth embodiment of the present invention will be described with reference to the figures.

Figure 24:
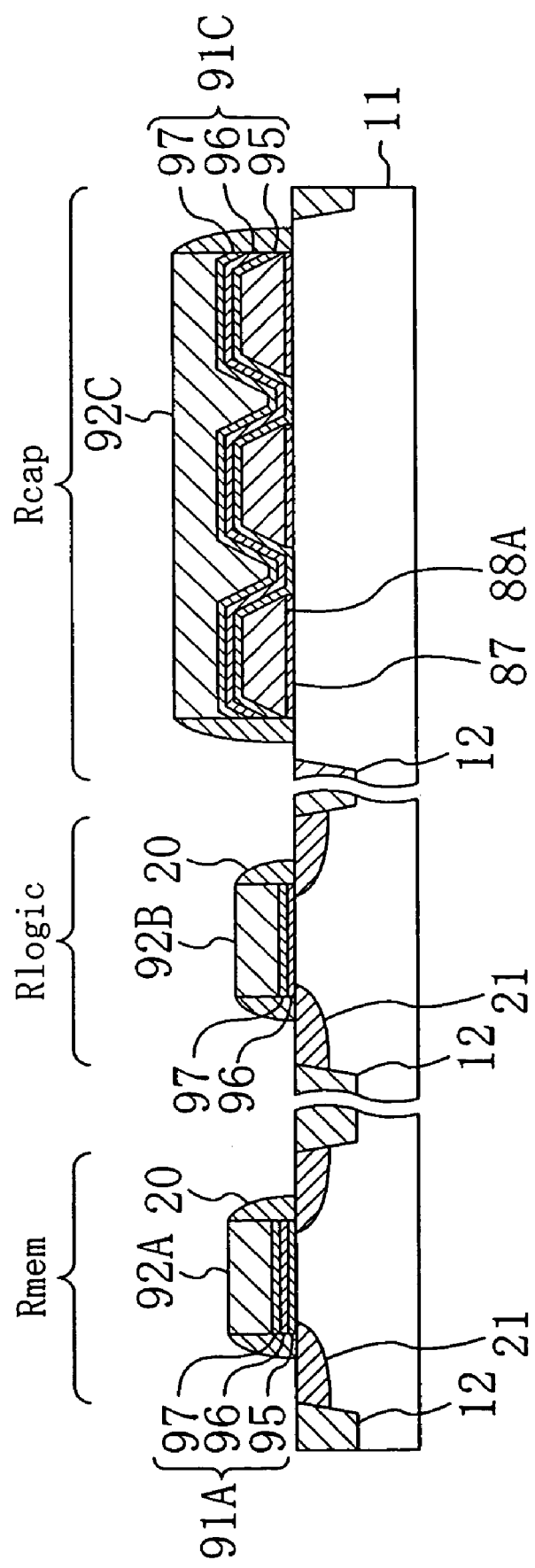
FIG. 24 is a cross-sectional view of a non-volatile semiconductor memory device according to an eighth embodiment of the present invention.

FIG. 24 shows a cross-sectional structure of a non-volatile semiconductor memory device according to the eighth embodiment of the present invention. In FIG. 24, the same members as those of the non-volatile semiconductor memory device of FIG. 19 are denoted with the same reference numerals and characters, and description thereof is omitted.

As shown in FIG. 24, in the non-volatile semiconductor memory device of the eighth embodiment, the storage element in the storage circuit region Rmem is formed as an MNOS-type storage element. The non-volatile semiconductor memory device of the eighth embodiment is different from that of the fourth embodiment in the structure of the capacitor.

In the capacitor region Rcap, a lower electrode 88A is formed on a semiconductor substrate 11 with a first silicon oxide film 87 interposed therebetween. More specifically, the lower electrode 88A is formed in a square region of about 200 μm×about 200 μm, and is formed from polysilicon. Like the lower electrodes of FIGS. 2A to 2C and FIGS. 3A to 3C, the lower electrode 88A is formed by shaping a plate-like conductive film so as to increase the surface area. An upper electrode 92C is formed on the lower electrode 88A with a capacitor capacitance insulating film 91C interposed therebetween. The upper electrode 92C is formed from polysilicon. The capacitor capacitance insulating film 91C is formed from a second silicon oxide film 89, a third silicon oxide film 96 and a silicon nitride film 97.

In the storage circuit region Rmem, a charge storage film 91A is formed on the semiconductor substrate 11. The charge storage film 91A is a lamination of the second silicon oxide film 89, the third silicon oxide film 96 and the silicon nitride film 97. A first gate electrode 92A is formed on the charge storage film 91A. The first gate electrode 92A is formed from polysilicon.

A sidewall 20 is formed on both sides of the first gate electrode 92A. A source/drain region 21 is formed in the surface region of the semiconductor substrate 11 so as to extend from a position inside the sidewall 20 to a position outside the sidewall 20.

In the logic circuit region Rlogic, a second gate electrode 92B is formed on the semiconductor substrate 11 with the third silicon oxide film 96 and the silicon nitride film 97 interposed therebetween. The second gate electrode 92B is formed from polysilicon. The third silicon oxide film 96 and the silicon nitride film 97 in the logic circuit region Rlogic serve as a gate insulating film of a logic element. A sidewall 20 is formed on both sides of the second gate electrode 92B. A source/drain region 21 is formed in the surface region of the semiconductor substrate 11 so as to extend from a position inside the sidewall 20 to a position outside the sidewall 20.

In the non-volatile semiconductor memory device of the eighth embodiment, the charge storage film 91A in the storage circuit region Rmem and the capacitor capacitance insulating film 91C in the capacitor region Rcap are preferably formed from an insulating film which is formed in the same step. Moreover, the first gate electrode 92A in the storage circuit region Rmem, the second gate electrode 92B in the logic circuit region Rlogic and the upper electrode 92C in the capacitor region Rcap are preferably formed from a conductive film which is formed in the same step. This enables the step of forming the storage element and the step of forming the capacitor to be partially conducted in the same process. It should be appreciated that the charge storage film 91A and the capacitor capacitance insulating film 91C may alternatively be formed from insulating films which are formed in separate steps, respectively, and the first gate electrode 92A, the second gate electrode 92B and the upper electrode 92C may alternatively be formed from conductive films which are formed in separate steps, respectively.

In the non-volatile semiconductor memory device of the eighth embodiment, the lower electrode 88A is formed from a conductive film. Therefore, the lower electrode is less likely to be subjected to depletion as compared to the case where the semiconductor substrate 11 is used for the lower electrode. As a result, stable capacitor characteristics can be obtained.

Moreover, in the non-volatile semiconductor memory device of the eighth embodiment, each of the charge storage film 91A and the capacitor capacitance insulating film 91C is a lamination of the second silicon oxide film 95, the third silicon oxide film 96 and the silicon nitride film 97. This enables improvement in reliability of the charge storage film 91A and the capacitor capacitance insulating film 91C. Moreover, the third silicon oxide film 96 and the silicon nitride film 97 are used as a gate insulating film of the logic element. This enables reduction in film thickness without reducing reliability, as compared to the case where a single-layer silicon oxide film is used as a gate insulating film of the logic element.

Hereinafter, a method for manufacturing the above non-volatile semiconductor memory device of the eighth embodiment will be described with reference to the figures.

Figure 25A:
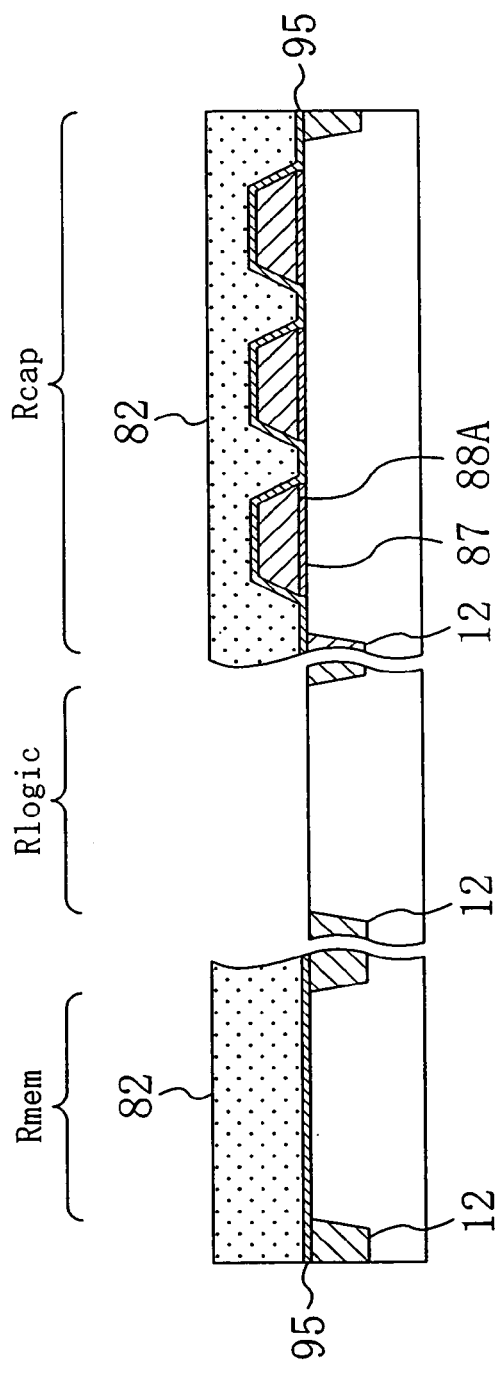
FIGS. 25A and 25B are cross-sectional views sequentially illustrating the steps of a method for manufacturing a non-volatile semiconductor memory device according to the eighth embodiment of the present invention.
Figure 25B:
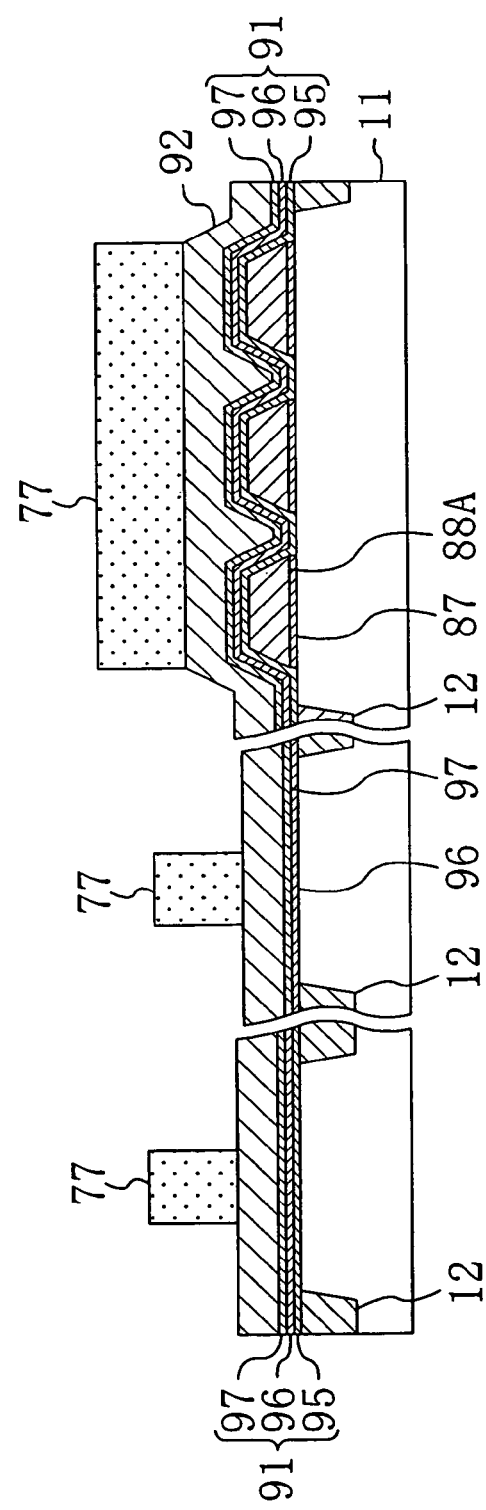

FIGS. 25A and 25B are cross-sectional views sequentially illustrating the steps of a method for manufacturing a non-volatile semiconductor memory device according to the eighth embodiment. In FIGS. 25A and 25B, the same members as those of FIG. 24 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

Like the step of FIG. 20A, a first silicon oxide film 87 and a first conductive film 88 are deposited on the whole surface of the semiconductor substrate 11.

As shown in FIG. 25A, the first conductive film 88 is patterned into a lower electrode 88A, and a second silicon oxide film 95 is then deposited on the whole surface of the semiconductor substrate 11 including the lower electrode 88A by a reduced pressure CVD method. Thereafter, a resist pattern 82 is formed by a photolithography method.

The resist pattern 82 masks the storage circuit region Rmem and the capacitor region Rcap and exposes the logic circuit region Rlogic. By using the resist pattern 82 as a mask, the exposed portion of the second silicon oxide film 95, i.e., the second silicon oxide film 95 in the logic circuit region Rlogic, is etched away by a wet etching method.

As shown in FIG. 25B, the resist pattern 82 is then removed. Thereafter, a third silicon oxide film 96, a silicon nitride film 97 and a second conductive film 92 are sequentially deposited on the exposed surface of the semiconductor substrate 11 in the logic circuit region Rlogic and the whole surface of the second silicon oxide film 95 by a reduced pressure CVD method. An ON film 91 is thus formed in the storage circuit region Rmem and the capacitor region Rcap as a lamination of the second silicon oxide film 95, the third silicon oxide film 96 and the silicon nitride film 97. A resist pattern 77 is then formed on the second conductive film 92 by a photolithography method. The resist pattern 77 is used to pattern a storage element, a logic element and a capacitor in the storage circuit region Rmem, the logic circuit region Rlogic and the capacitor region Rcap, respectively.

The second conductive film 92, the silicon nitride film 97, the third silicon oxide film 96 and the second silicon oxide film 95 are sequentially etched by using the resist pattern 77 as a mask. As a result, in the storage circuit region Rmem, the charge storage film 91A is formed from the second silicon oxide film 95, the third silicon oxide film 96 and the silicon nitride film 97, and the first gate electrode 92A is formed from the second conductive film 92. At the same time, in the logic circuit region Rlogic, the gate insulating film is formed from the third silicon oxide film 96 and the silicon nitride film 97, and the second gate electrode 92B is formed from the second conductive film 92. Moreover, in the capacitor region Rcap, the capacitor capacitance insulating film 91C is formed from the second silicon oxide film 95, the third silicon oxide film 96 and the silicon nitride film 97, and the upper electrode 92C is formed from the second conductive film 92.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the eighth embodiment in FIG. 24 is thus completed.

(Ninth Embodiment)

Hereinafter, the ninth embodiment of the present invention will be described with reference to the figures.

Figure 26:
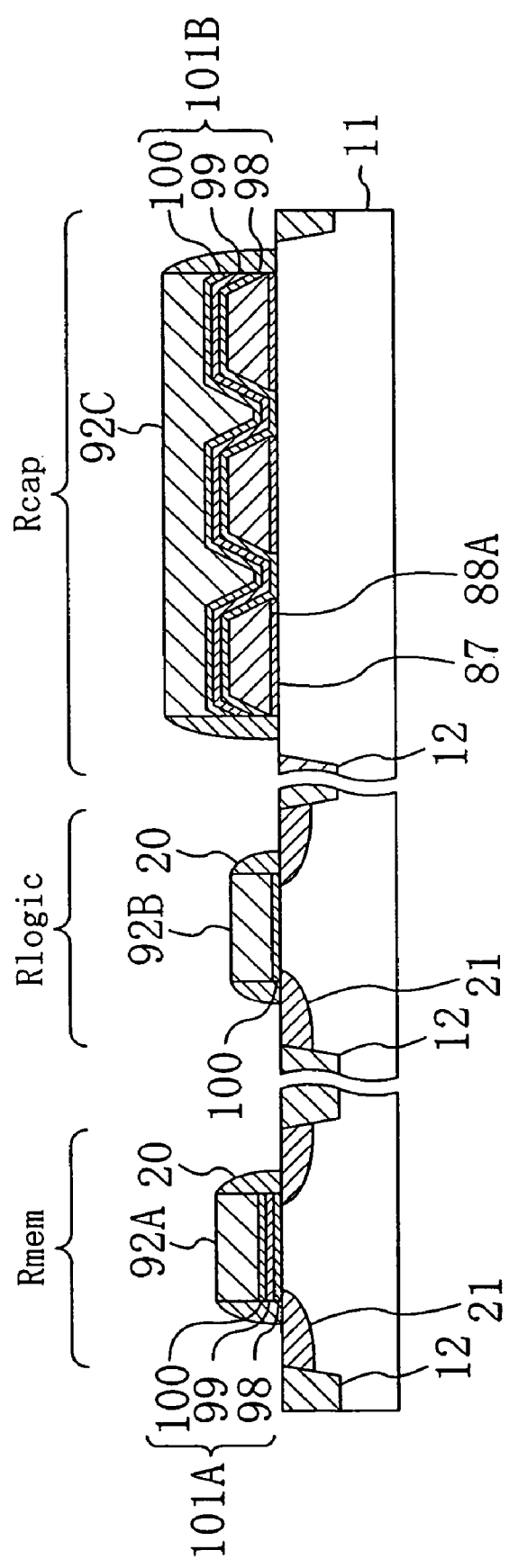
FIG. 26 is a cross-sectional view of a non-volatile semiconductor memory device according to a ninth embodiment of the present invention.

FIG. 26 shows a cross-sectional structure of a non-volatile semiconductor memory device according to the ninth embodiment of the present invention. In FIG. 26, the same members as those of the non-volatile semiconductor memory device of FIG. 19 are denoted with the same reference numerals and characters, and description thereof is omitted.

As shown in FIG. 26, in the non-volatile semiconductor memory device of the ninth embodiment, the storage element in the storage circuit region Rmem is formed as an MONOS-type storage element. The non-volatile semiconductor memory device of the ninth embodiment is different from that of the fifth embodiment in the structure of the capacitor.

In the capacitor region Rcap, a lower electrode 88A is formed on a semiconductor substrate 11 with a first silicon oxide film 87 interposed therebetween. More specifically, the lower electrode 88A is formed in a square region of about 200 μm×about 200 μm, and is formed from polysilicon. Like the lower electrodes of FIGS. 2A to 2C and FIGS. 3A to 3C, the lower electrode 88A is formed by shaping a plate-like conductive film so as to increase the surface area. An upper electrode 92C is formed on the lower electrode 88A with a capacitor capacitance insulating film 101B interposed therebetween. The upper electrode 92C is formed from polysilicon. The capacitor capacitance insulating film 101B is formed from a second silicon oxide film 98, a silicon nitride film 99 and a third silicon oxide film 100.

In the storage circuit region Rmem, a charge storage film 101A is formed on the semiconductor substrate 11. The charge storage film 101A is a lamination of the second silicon oxide film 98, the silicon nitride film 99 and the third silicon oxide film 100. A first gate electrode 92A is formed on the charge storage film 101A. The first gate electrode 92A is formed from polysilicon.

A sidewall 20 is formed on both sides of the first gate electrode 92A. A source/drain region 21 is formed in the surface region of the semiconductor substrate 11 so as to extend from a position inside the sidewall 20 to a position outside the sidewall 20.

In the logic circuit region Rlogic, a second gate electrode 92B is formed on the semiconductor substrate 11 with the third silicon oxide film 100 interposed therebetween. The second gate electrode 92B is formed from polysilicon. A sidewall 20 is formed on both sides of the second gate electrode 92B. The third silicon oxide film 100 in the logic circuit region Rlogic serves as a gate insulating film of a logic element. A source/drain region 21 is formed in the surface region of the semiconductor substrate 11 so as to extend from a position inside the sidewall 20 to a position outside the sidewall 20.

In the non-volatile semiconductor memory device of the ninth embodiment, the charge storage film 101A in the storage circuit region Rmem and the capacitor capacitance insulating film 101B in the capacitor region Rcap are preferably formed from an insulating film which is formed in the same step. Moreover, the first gate electrode 92A in the storage circuit region Rmem, the second gate electrode 92B in the logic circuit region Rlogic and the upper electrode 92C in the capacitor region Rcap are preferably formed from a conductive film which is formed in the same step. This enables the step of forming the storage element and the step of forming the capacitor to be partially conducted in the same process. It should be appreciated that the charge storage film 101A and the capacitor capacitance insulating film 101B may alternatively be formed from insulating films which are formed in separate steps, respectively, and the first gate electrode 92A, the second gate electrode 92B and the upper electrode 92C may alternatively be formed from conductive films which are formed in separate steps, respectively.

In the non-volatile semiconductor memory device of the ninth embodiment, the lower electrode 88A is formed from a conductive film. Therefore, the lower electrode is less likely to be subjected to depletion as compared to the case where the semiconductor substrate 11 is used for the lower electrode. As a result, stable capacitor characteristics can be obtained.

Moreover, in the non-volatile semiconductor memory device of the ninth embodiment, each of the charge storage film 101A and the capacitor capacitance insulating film 101B is a lamination (ONO film) of the second silicon oxide film 98, the silicon nitride film 99 and the third silicon oxide film 100. This enables improvement in reliability of the charge storage film 101A and the capacitor capacitance insulating film 101B over the structure using an ON film.

Hereinafter, a method for manufacturing the above non-volatile semiconductor memory device of the ninth embodiment will be described with reference to the figures.

Figure 27A:
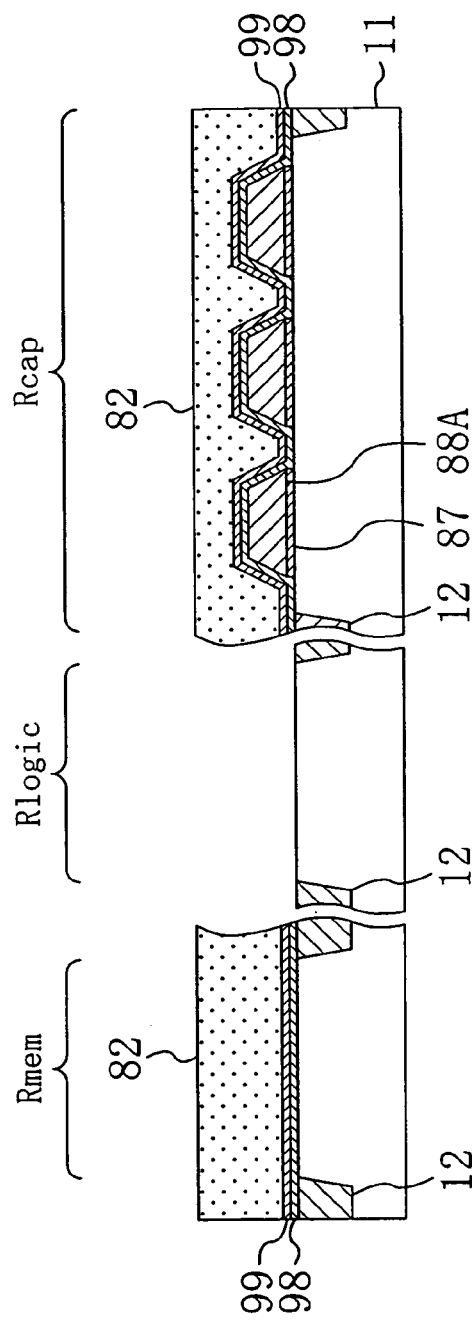
FIGS. 27A and 27B are cross-sectional views sequentially illustrating the steps of a method for manufacturing a non-volatile semiconductor memory device according to the ninth embodiment of the present invention.
Figure 27B:
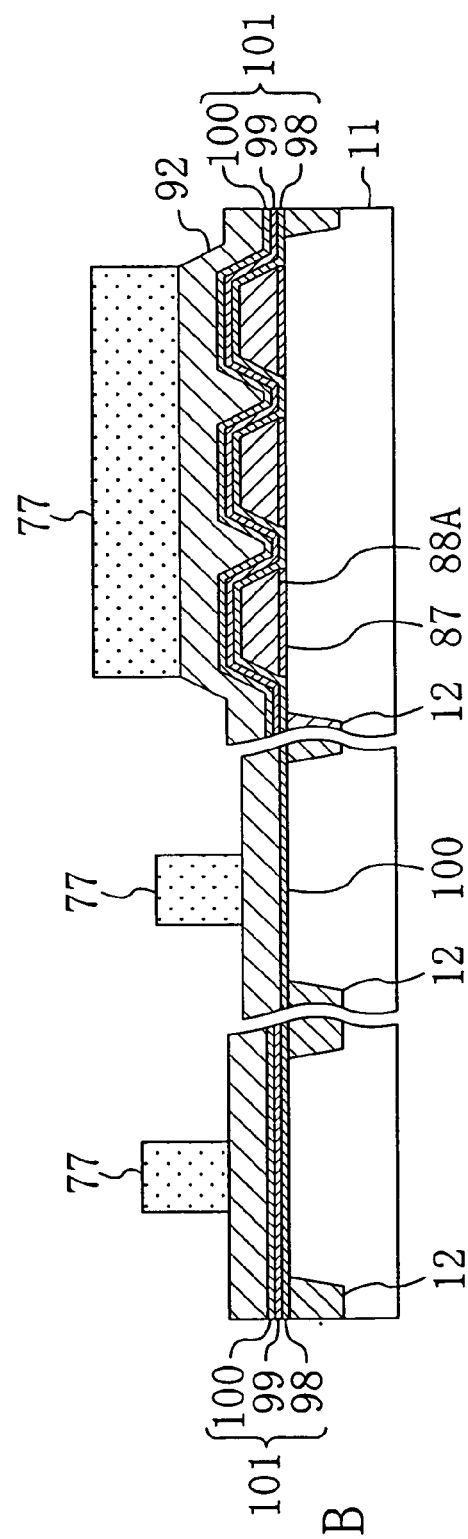

FIGS. 27A and 27B are cross-sectional views sequentially illustrating the steps of a method for manufacturing a non-volatile semiconductor memory device according to the ninth embodiment. In FIGS. 27A and 27B, the same members as those of FIG. 26 are denoted with the same reference numerals and characters, and description thereof is omitted.

Like the step of FIG. 5A, an element isolation insulating film 12 is formed in a semiconductor substrate 11 in order to define a storage circuit region Rmem, a logic circuit region Rlogic, and a capacitor region Rcap which are electrically isolated from each other.

Like the step of FIG. 20A, a first silicon oxide film 87 and a first conductive film 88 are deposited on the whole surface of the semiconductor substrate 11.

As shown in FIG. 27A, the first conductive film 88 is patterned into a lower electrode 88A, and a second silicon oxide film 98 and a silicon nitride film 99 are then sequentially deposited on the whole surface of the semiconductor substrate 11 including the lower electrode 88A by a reduced pressure CVD method. Thereafter, a resist pattern 82 is formed by a photolithography method. The resist pattern 82 masks the storage circuit region Rmem and the capacitor region Rcap and exposes the logic circuit region Rlogic. By using the resist pattern 82 as a mask, the silicon nitride film 99 and the second silicon oxide film 98 in the logic circuit region Rlogic are sequentially etched away.

As shown in FIG. 27B, the resist pattern 82 is then removed. Thereafter, a third silicon oxide film 100 and a second conductive film 92 are sequentially deposited on the exposed surface of the semiconductor substrate 11 in the logic circuit region Rlogic and the whole surface of the silicon nitride film 99 by a reduced pressure CVD method. An ONO film 101 is thus formed in the storage circuit region Rmem and the capacitor region Rcap as a lamination of the second silicon oxide film 98, the silicon nitride film 99 and the third silicon oxide film 100. A resist pattern 77 is then formed on the second conductive film 92 by a photolithography method. The resist pattern 77 is used to pattern a storage element, a logic element and a capacitor in the storage circuit region Rmem, the logic circuit region Rlogic and the capacitor region Rcap, respectively.

The second conductive film 92, the third silicon oxide film 100, the silicon nitride film 99 and the second silicon oxide film 98 are sequentially etched by using the resist pattern 77 as a mask. As a result, in the storage circuit region Rmem, the charge storage film 101A is formed from the second silicon oxide film 98, the silicon nitride film 99 and the third silicon oxide film 100, and the first gate electrode 92A is formed from the second conductive film 92. At the same time, in the logic circuit region Rlogic, the gate insulating film is formed from the third silicon oxide film 100, and the second gate electrode 92B is formed from the second conductive film 92. Moreover, in the capacitor region Rcap, the capacitor capacitance insulating film 101B is formed from the second silicon oxide film 98, the silicon nitride film 99 and the third silicon oxide film 100, and the upper electrode 92C is formed from the second conductive film 92.

Like the step of FIG. 8, an insulating film for forming a sidewall is then formed. This insulating film is then subjected to an anisotropic dry etching method in order to form a sidewall 20 on the side surfaces of the storage element, the logic element and the capacitor in a self-aligned manner. Impurities are then introduced into the semiconductor substrate 11 by using the sidewalls 20 as a mask. As a result, source/drain regions 21 are formed in the semiconductor substrate 11. The non-volatile semiconductor memory device of the ninth embodiment in FIG. 26 is thus completed.

What is claimed is:

1. A method for manufacturing a non-volatile semiconductor memory device, comprising:

a first step of forming an element isolation insulating film in a semiconductor substrate in order to define a storage circuit region and a capacitor region;

a second step of forming a concavity in a semiconductor substrate included in the capacitor region, and implanting impurities into the concavity to form a lower electrode;

a third step of sequentially forming an insulating film and a conductive film on the semiconductor substrate including the lower electrode;

a fourth step of forming in the storage circuit region a charge storage film from the insulating film and a first gate electrode from the conductive film; and a fifth step of forming in the capacitor region a capacitor capacitance insulating film from the insulating film and an upper electrode from the conductive film.

2. The method according to claim 1, wherein, in the third step, the insulating film is formed by depositing a silicon oxide film on the semiconductor substrate and nitriding an upper portion of the deposited silicon oxide film.

3. The method according to claim 1, wherein, in the third step, the insulating film is formed by sequentially depositing a silicon oxide film and a silicon nitride film on the semiconductor substrate.

4. The method according to claim 1, wherein, in the third step, the insulating film is formed by sequentially forming a first silicon oxide film, a second silicon oxide film and a silicon nitride film on the semiconductor substrate.

5. The method according to claim 1, wherein, in the third step, the insulating film is formed by sequentially forming a first silicon oxide film, a silicon nitride film and a second silicon oxide film on the semiconductor substrate.

6. The method according to claim 1, wherein, in the second step, the lower electrode is formed into a plurality of concavities, a plurality of convexities, or a plurality of stripe-shaped convexities.

7. A method for manufacturing a non-volatile semiconductor memory device, comprising:

a first step of forming an element isolation insulating film in a semiconductor substrate in order to define a storage circuit region, a logic circuit region and a capacitor region;

a second step of forming a concavity in the semiconductor substrate included in the capacitor region, and introducing impurities into the semiconductor substrate from a wall surface and a bottom surface of the concavity to form a lower electrode;

a third step of sequentially forming a first insulating film, a second insulating film and a first conductive film on the semiconductor substrate including the lower electrode;

a fourth step of forming in the storage circuit region a charge storage film from the first insulating film and the second insulating film and a first gate electrode from the first conductive film;

a fifth step of forming in the logic circuit region a gate insulating film from the first insulating film and the second insulating film and a second gate electrode from the first conductive film; and a sixth step of forming in the capacitor region a capacitor capacitance insulating film from the first insulating film and the second insulating film and an upper electrode from the first conductive film.

8. The method according to claim 7, wherein, in the third step, the second insulating film is formed by nitriding an upper portion of the first insulating film.

9. The method according to claim 7, wherein, in the third step, the second insulating film is formed by depositing a silicon nitride film on the first insulating film.

10. The method according to claim 7, wherein the first insulating film is a silicon oxide film.

11. The method according to claim 7, wherein, in the second step, the lower electrode is formed into a plurality of concavities, a plurality of convexities, or a plurality of stripe-shaped convexities.

12. A method for manufacturing a non-volatile semiconductor memory device, comprising:

a first step of forming an element isolation insulating film in a semiconductor substrate in order to define a storage circuit region, a logic circuit region and a capacitor region;

a second step of forming a concavity in the semiconductor substrate included in the capacitor region, and introducing impurities into the semiconductor substrate from a wall surface and a bottom surface of the concavity to form a lower electrode;

a third step of forming a first insulating film on the semiconductor substrate including the lower electrode;

a fourth step of removing the first insulating film included in the logic circuit region;

a fifth step of sequentially depositing a second insulating film, a third insulating film and a first conductive film on an exposed surface of the semiconductor substrate in the logic circuit region and on the first insulating film in the storage circuit region and the capacitor region;

a sixth step of forming in the storage circuit region a charge storage film from the first insulating film, the second insulating film and the third insulating film and a first gate electrode from the first conductive film;

a seventh step of forming in the logic circuit region a gate insulating film from the second insulating film and the third insulating film and a second gate electrode from the first conductive film; and an eighth step of forming in the capacitor region a capacitor capacitance insulating film from the first insulating film, the second insulating film and the third insulating film and an upper electrode from the first conductive film.

13. The method according to claim 12, wherein each of the first insulating film and the second insulating film is a silicon oxide film.

14. The method according to claim 1, wherein the third insulating film is a silicon nitride film.

15. The method according to claim 12, wherein, in the second step, the lower electrode is formed into a plurality of concavities, a plurality of convexities, or a plurality of stripe-shaped convexities.

16. A method for manufacturing a non-volatile semiconductor memory device, comprising:

a first step of forming an element isolation insulating film in a semiconductor substrate in order to define a storage circuit region, a logic circuit region and a capacitor region;

a second step of forming a concavity in the semiconductor substrate included in the capacitor region, and introducing impurities into the semiconductor substrate from a wall surface and a bottom surface of the concavity to form a lower electrode;

a third step of sequentially forming a first insulating film and a second insulating film on the semiconductor substrate including the lower electrode;

a fourth step of sequentially removing the second insulating film and the first insulating film which are included in the logic circuit region;

a fifth step of sequentially depositing a third insulating and a first conductive film on an exposed surface of the semiconductor substrate in the logic circuit region and on the second insulating film in the storage circuit region and the capacitor region;

a sixth step of forming in the storage circuit region a charge storage film from the first insulating film, the second insulating film and the third insulating film and a first gate electrode from the first conductive film;

a seventh step of forming in the logic circuit region a gate insulating film from the third insulating film and a second gate electrode from the first conductive film; and an eighth step of forming in the capacitor region a capacitor capacitance insulating film from the first insulating film, the second insulating film and the third insulating film and an upper electrode from the first conductive film.

17. The method according to claim 16, wherein each of the first insulating film and the third insulating film is a silicon oxide film.

18. The method according to claim 16, wherein the second insulating film is a silicon nitride film.

19. The method according to claim 16, wherein, in the second step, the lower electrode is formed into a plurality of concavities, a plurality of convexities, or a plurality of stripe-shaped convexities.

* * * * *